(12) United States Patent
Schmidt et al.

(10) Patent No.: US 9,546,319 B2
(45) Date of Patent: Jan. 17, 2017

(54) PHOSPHORS, SUCH AS NEW NARROW-BAND RED EMITTING PHOSPHORS FOR SOLID STATE LIGHTING

(71) Applicant: KONINKLIJKE PHILIPS N.V., Eindhoven (NL)

(72) Inventors: Peter Josef Schmidt, Eindhoven (NL); Frauke Charlotte Hintze, Eindhoven (NL); Philipp Alexander Hubert Pust, Eindhoven (NL); Volker Weiler, Eindhoven (NL); Cora Sieglinde Hecht, Eindhoven (NL); Sebastian Florian Schmiechen, Eindhoven (NL); Wolfgang Schnick, Eindhoven (NL); Detlef Uwe Wiechert, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 110 days.

(21) Appl. No.: 14/401,368

(22) PCT Filed: May 9, 2013

(86) PCT No.: PCT/IB2013/053747
§ 371 (c)(1),
(2) Date: Nov. 14, 2014

(87) PCT Pub. No.: WO2013/175336
PCT Pub. Date: Nov. 28, 2013

(65) Prior Publication Data
US 2015/0123155 A1 May 7, 2015

(30) Foreign Application Priority Data

May 22, 2012 (EP) .................................. 12168850
Jan. 28, 2013 (EP) .................................. 13152870

(51) Int. Cl.
*C09K 11/08* (2006.01)
*C09K 11/77* (2006.01)
(Continued)

(52) U.S. Cl.
CPC ........ *C09K 11/7728* (2013.01); *C09K 11/0883* (2013.01); *C09K 11/7706* (2013.01);
(Continued)

(58) Field of Classification Search
CPC .. H01L 33/502; H01L 33/504; C09K 11/7734; C09K 11/7792
See application file for complete search history.

(56) References Cited

U.S. PATENT DOCUMENTS 8,153,025 B2 4/2012 Schmidt
2005/0230689 A1 10/2005 Setlur et al.

FOREIGN PATENT DOCUMENTS

CN 102395650 A 3/2012
JP 2006257326 A 9/2006
(Continued)

OTHER PUBLICATIONS

"The 5D Level Positions of the Trivalent Lanthanides in Inorganic Compounds" P Dorenbos Journal of Luminescence 91, (2000) p. 155-176.
(Continued)

*Primary Examiner* — Carol M Koslow

(57) ABSTRACT

The invention provides, amongst others for application in a lighting unit, a phosphor having the formula $M_{1-x-y-z}Z_z A_a B_b C_c D_d E_e N_{4-n} O_n : ES_x RE_y$ (I), with M=selected from the group consisting of Ca, Sr, and Ba; Z=selected from the group consisting of monovalent Na, K, and Rb; A=selected from the group consisting of divalent Mg, Mn, Zn, and Cd; B=selected from the group consisting of trivalent B, Al and Ga; C=selected from the group consisting of tetravalent Si,
(Continued)

(1) —— Ba0.95Sr0.05Mg2Ga2N4:Eu(2%)   (2) - - - BaMg2Ga2N4:Eu(2%)
(3) - - - - SrMg3SiN4:Eu(2%)   (4) —·— SrMg2Al2N4:Eu(2%)
(5) —··— BaMg3SiN4:Eu(2%)

Ge, Ti, and Hf; D=selected from the group consisting of monovalent Li, and Cu; E=selected for the group consisting of P, V, Nb, and Ta; ES=selected from the group consisting of divalent Eu, Sm and Yb; RE=selected from the group consisting of trivalent Ce, Pr, Nd, Sm, Eu, Gd, Tb, Dy, Ho, Er, and Tm; $0 \le x \le 0.2$; $0 \le y \le 0.2$; $0 < x+y \le 0.4$; $0 \le z < 1$; $0 \le n \le 0.5$; $0 \le a \le 4$ (such as $2 \le a \le 3$); $0 \le b \le 4$; $0 \le c \le 4$; $0 \le d \le 4$; $0 \le e \le 4$; $a+b+c+d+e=4$; and $2a+3b+4c+d+5e=10-y-n+z$.

19 Claims, 6 Drawing Sheets

(51) Int. Cl.
    *H05B 33/14*     (2006.01)
    *H01L 33/50*     (2010.01)

(52) U.S. Cl.
    CPC ...... *C09K 11/7715* (2013.01); *C09K 11/7734* (2013.01); *C09K 11/7792* (2013.01); *H01L 33/502* (2013.01); *H05B 33/14* (2013.01)

(56) References Cited

FOREIGN PATENT DOCUMENTS

| WO | | 2010119375 | A1 | 10/2010 |
|---|---|---|---|---|
| WO | WO 2010/119375 | | * | 10/2010 |
| WO | | 2011034226 | A1 | 3/2011 |

OTHER PUBLICATIONS

"Control of AlPO4 Nanoparticle Coating on LiCOo2 by Using Water or Ethanol" Cho et al, Electrochimica Acta 50 (2005) p. 4182-4187.
Microencapsulation of Moisture Sensitive CAS Eu2 Particles With Aluminum Oxide Avci et al, Journal of the Electrochemical Society 156 (11) : 2009) p. J333-J337.
"Sr (Mg3Ge) N4 and Sr(Mg2gAs)N4; New Isostructural Mg-Containing Quaternary Nitrides With Nitridometallate . . . " Park et al, Solid State Sciences, (2008) p. 1-7, anions of [(Mg3Ge)N4] and [(Mg2Ga2)N4] in a 3D-network structure.
Database Inspec (Online) The Institution of Electrical Engineers, Stevenage, GB Eu2 Activated Silicon-Onynitride Ca3Si2O4N2) Yi-Chen Chiu et al . . . May 9, 2011 Database Accession No. 12051250.
Das Neue Orthotitanat CsNa3 . . . Z. Weib et al, Z. Anorg. Allg. Chem 622 (1996) p. 1715-1720, [TiO4].
Das Erste Quaternare Oxostannat Mit"Bernet et al, Z. Anorg. Allg. Chem 571 (1989) p. 101-112, Inselstruktur": RbNa3[SnO4].
Ein Neues Oxoplumbat (IV) CsNa3, Hoppe et al, 1987, Revue De Chimie Minerale, p. 96-115, [PbO4].
First Office Action issued Dec. 14, 2015 from Chinese Patent Application No. 201380026807.6.
International Search Report and Written Opinion mailed Aug. 13, 2013 from International Application No. PCT/IB2013/053747.
Werthmann et al., "On Oxides of the New Formula Type A[T4O4]: KLi3SiO4, KLi3 GeO4, and KLi3TiO4", Zeitschrift fur anorganische und allgemeine Chemi, vol. 509, Issue 2, Feb. 1984, pp. 7-22.

* cited by examiner (1) —— Ba0.95Sr0.05Mg2Ga2N4:Eu(2%)   (2) - - - BaMg2Ga2N4:Eu(2%)
(3) ---- SrMg3SiN4:Eu(2%)   (4) —·— SrMg2Al2N4:Eu(2%)
(5) —··— BaMg3SiN4:Eu(2%)

PHOSPHORS, SUCH AS NEW NARROW-BAND RED EMITTING PHOSPHORS FOR SOLID STATE LIGHTING

CROSS-REFERENCE TO PRIOR APPLICATIONS

This application is the U.S. National Phase application under 35 U.S.C. §371 of International Application No. PCT/IB2013/053747, filed on May 9, 2013, which claims the benefit of EP Patent Application No. 13152870.5, filed on Jan. 28, 2013 and EP Patent Application No. 12168850.1, filed on May 22, 2012. These applications are hereby incorporated by reference herein.

FIELD OF THE INVENTION

The invention relates to a class of new phosphors, as well as individual members thereof, and to a lighting unit comprising one or more of such phosphors, and optionally one or more other phosphors, for generating luminescence.

BACKGROUND OF THE INVENTION

Red luminescent materials for LED (light emitting device) applications are known in the art. U.S. Pat. No. 8,153,025, for instance, describes a red light emitting material of the formula $M_{1-y}A_{1+x}Si_{4-x}N_{7-x-2y}O_{x+2y}$:RE whereby M is selected out of the group comprising Ba, Sr, Ca, Mg or mixtures thereof, A is selected out of the group comprising Al, Ga, B or mixtures thereof, RE is selected out of the group comprising rare earth metals, Y, La, Sc or mixtures thereof and x is $\geq 0$ and $\leq 1$ and y is $\geq 0$ and $\leq 0.2$. This material is believed to crystallize in a structure type that comprises two individual lattice sites for rare earth metal incorporation, which leads to an improved lighting behavior.

SUMMARY OF THE INVENTION

There is still a need for obtaining good inorganic luminescent materials that can replace or supplement existing luminescent materials, such as for solid state lighting, for instance because of better efficiency or other advantageous luminescent properties like excitation and/or emission band position and/or emission band width. The luminous efficacy of illumination grade white phosphor converted (pc) LEDs is currently limited by the spectral width of the emission band of the red emitting phosphor component.

Hence, it is an aspect of the invention to provide an alternative phosphor, especially an alternative red phosphor and/or optionally a yellow and/or a green phosphor, which preferably further at least partly obviates one or more of above-described drawbacks, which preferably absorbs well in the blue and/or UV (and/or green and/or yellow light), especially in the blue, and/or which efficiently converts the absorbed light into visible light, especially red light (and/or green and/or yellow light). However, other colors (in the visible) may be of interest as well, like cyan or orange. It is further an aspect to provide an alternative lighting unit, configured to use such alternative (red) phosphor (for instance as luminescent material, optionally in combination with other phosphors).

In a first aspect, the invention provides a lighting unit comprising a light source, configured to generate light source light and a luminescent material, configured to convert at least part of the light source light into luminescent material light, wherein the light source comprises a light emitting diode (LED), or optionally (or additionally) another light source, and wherein the luminescent material comprises a phosphor having the (chemical) formula $M_{1-x-y-z}Z_zA_aB_bC_cD_dE_eN_{4-n}O_n$:$ES_x$,$RE_y$ (phosphor having formula (I)), with M=selected from the group consisting of Ca (calcium), Sr (strontium), and Ba (barium); Z selected from the group consisting of monovalent Na (sodium), K (potassium), and Rb (rubidium); A=selected from the group consisting of divalent Mg (magnesium), Mn (manganese), Zn (zinc), and Cd (cadmium) (especially, A=selected from the group consisting of divalent Mg (magnesium), Mn (manganese), and Zn (zinc), even more especially selected from the group consisting of divalent Mg (magnesium), Mn (manganese); B=selected from the group consisting of trivalent B (boron), Al (aluminum) and Ga (gallium); C=selected from the group consisting of tetravalent Si (silicon), Ge (germanium), Ti (titanium) and Hf (hafnium); D selected from the group consisting of monovalent Li (lithium), and Cu (copper); E selected for the group consisting of P (the element phosphor), V (vanadium), Nb (niobium), and Ta (tantalum); ES=selected from the group consisting of divalent Eu (europium), Sm (samarium) and ytterbium, especially selected from the group consisting of divalent Eu and Sm; RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium); with $0 \leq x \leq 0.2$; $0 \leq y \leq 0.2$; $0 \leq x+y \leq 0.4$; $0 \leq z < 1$; $0 \leq n \leq 0.5$; $0 \leq a \leq 4$ (such as $2 \leq a \leq 3$); $0 \leq b \leq 4$; $0 \leq c \leq 4$; $0 \leq d \leq 4$; $0 \leq e \leq 4$; $a+b+c+d+e=4$; and $2a+3b+4c+d+5e=10-y-n+z$. Especially, $z \leq 0.9$, such as $z \leq 0.5$. Further, especially $x+y+z \leq 0.2$.

The phosphor, when illuminated by the light source light, thus converts at least part of the light source light into luminescent material light (emission). The luminescent material light thus contains luminescence from the phosphor (with formula (I)), and optionally of other phosphors (see also below).

In a second aspect, the invention also provides such phosphor per se, i.e. a phosphor having the formula $M_{1-x-y-z}Z_zA_aB_bC_cD_dE_eN_{4-n}O_n$:$ES_x$,$RE_y$ (I), with M selected from the group consisting of Ca, Sr, and Ba; Z selected from the group consisting of monovalent Na, K, and Rb; A selected from the group consisting of divalent Mg, Mn, Zn, and Cd (especially A selected from the group consisting of divalent Mg, Mn, and Zn; even more especially selected from the group consisting of Mg and Mn, especially Mg); B selected from the group consisting of trivalent B, Al and Ga; C selected from the group consisting of tetravalent Si, Ge, Ti, and Hf; D selected from the group consisting of monovalent Li, and Cu; E selected for the group consisting of P, V, Nb, and Ta; ES selected from the group consisting of divalent Eu, Sm and Yb, especially selected from the group consisting of divalent Eu and Sm; RE selected from the group consisting of trivalent Ce, Pr, Nd, Sm, Eu, Gd, Tb, Dy, Ho, Er, and Tm; $0 \leq x \leq 0.2$; $0 \leq y \leq 0.2$; $0 < x+y \leq 0.4$; $0 \leq z < 1$; $0 \leq n \leq 0.5$; $0 \leq a \leq 4$ (such as $2 \leq a \leq 3$); $0 \leq b \leq 4$; $0 \leq c \leq 4$; $0 \leq d \leq 4$; $0 \leq e \leq 4$; $a+b+c+d+e=4$; and $2a+3b+4c+d+5e=10-y-n+z$.

The invention also relates to a luminescent material at least comprising this phosphor and optionally one or more other materials, like one or more other phosphors and/or one or more other phases (like (remaining) flux material. The phosphor may also include impurities, like one or more of halogen impurities and metal impurities. The luminescent material, may next to the one or more phosphors as defined herein, also include other phases, like one or more of the—already indicated (remaining)—flux material, remaining starting material(s) and one or more phases that are also formed during synthesis of the one or more (respective) phosphors.

Likewise, the phosphor may also include other phases, like one or more of the—already indicated (remaining)— flux material, remaining starting material(s) and one or more phases that are also formed during synthesis of the one or more (respective) phosphors. In general, the weight percentage of such other phase(s) will be below about 10 wt. % (relative to the total weight of the phosphor.

As indicated above, the phosphor may also include impurities. This is known in the art. Hence, in embodiments chemical formulas like $Ba_{0.95}Sr_{0.05}Mg_2Ga_2N_4$:Eu; $BaMg_2Ga_2N_4$:Eu; $SrMg_3SiN_4$:Eu; $SrMg_2Al_2N_4$:Eu; $SrMg_2Ga_2N_4$:Eu; $BaMg_3SiN_4$:Eu; $CaLiAl_3N_4$:Eu; $SrLiAl_3N_4$:Eu; $CaLi_{0.5}MgAl_{2.5}N_4$:Eu; $SrLi_{0.5}MgAl_{2.5}N_4$: Eu; $(ST_{0.8}Ca_{0.2})_{0.995}LiAl_{2.91}Mg_{0.09}N_{3.91}O_{0.09}$:$EU_{0.005}$ $(Sr_{0.9}Ca_{0.1})_{0.905}Na_{0.09}LiAl_3N_{3.91}O_{0.09}$:$EU_{0.005}$ $Sr_{0.8}Ca_{0.03}Ba_{0.17})_{0.989}LiAl_{2.99}Mg_{0.01}N_4$:$Ce_{0.01}$, $Eu_{0.00i}$; $Ca_{0.995}LiAl_{2.995}Mg_{0.005}N_{3.995}O_{0.005}$:$Yb_{0.005}$ (YB(II)); $Na_{0.995}MgAl_3N_4$:$Eu_{0.005}$; $Na_{0.895}Ca_{0.1}Mg_{0.9}Li_{0.1}Al_3N_4$: $Eu_{0.005}$; $Sr_{0.99}LiMgAlSiN_4$:$Eu_{0.01}$; $Ca_{0.995}LiAl_{2.955}Mg_{0.045}N_{3.96}O_{0.04}$:$Ce_{0.005}$; $(Sr_{0.9}Ca_{0.1})_{0.998}Al_{1.99}Mg_{2.01}N_{3.99}O_{0.01}$: $EU_{0.002}$, $(Sr_{0.9}Ba_{0.1})_{0.998}Al_{1.99}Mg_{2.01}N_{3.99}O_{0.01}$:$EU_{0.002}$, (Sr,Ca)$Mg_2Al_2N_4$:Eu; (Sr, Ca)$Mg_2Al_2N_4$:Eu; $Ba_{0.95}Sr_{0.05}Mg_2Ga_2N_4$:Eu; $BaMg_2Ga_2N_4$:Eu; $SrMg_3SiN_4$: Eu; $SrMg_2Al_2N_4$:Eu; $SrMg_2Ga_2N_4$:Eu; $BaMg_3SiN_4$:Eu; (Sr, Ca)$Mg_3SiN_4$:Eu and (Sr,Ca)$Mg_2Al_2N_4$:Eu, such as defined below, etc., do not exclude the presence of impurities, for instance up to a total of about 500 ppm, especially up to about 200 ppm, even more especially up to about 200 ppm. Hence, even though the chemical formula does not indicate the presence of impurities, impurities that may (nevertheless) be present can for instance be selected from the group consisting of Li, Na, K, Sc, Y, Ti, Zr, V, Nb, Cr, Mo, Mn, Fe, Ru, Co, Rh, Ni, Pd, Cu, Zn, V, C, N, O, F, Al, Si, P, S, Cl, Ga, Ge, Se, Br, Lu, La, Ce, Pr, Nd, Sm, Eu, Gd, Tb, Dy, Ho, Er, Tm, Yb, Hf, Ta, W, Re, Os, Ir, Pt, Tl, Pb, and Bi. Here, impurities are listed. When for instance the chemical formula indicates the availability of Li or Eu, these are—even when available in small amounts—not considered as impurities. Hence, e.g. in $SrLiAl_3N_4$:Eu, Eu is not an impurity, but $SrLiAl_3N_4$:Eu may include e.g. 150 ppm Hf or Na or Mg (as impurity/impurities).

Further, the luminescent material may include one or more of scattering particles and a halide salt.

Requirements for a red phosphor component in a white LED may be that a color rendering of Ra8>90 is obtained and that (optionally in combination with other phosphors) a correlated color temperature in the 2500-5000 K range can be obtained. Ideally, the red phosphor component should show an emission peak in the 605-635 nm wavelength range with a full-width-half-maximum (FWHM) less than 80 nm. Requirements for a red phosphor component in a white LED may be that in a display backlighting configuration a color gamut of >90% of the NTSC standard is obtained and that (optionally in combination with other phosphors) a correlated color temperature in the 7000-11000 K range can be obtained. Ideally, the red phosphor component should show an emission peak in the 630-655 nm wavelength range with a full-width-half-maximum (FWHM) less than 80 nm.

However, as indicated above, also phosphors having other characteristics may be of interest.

The present invention advantageously provides alternative phosphors, which amongst others may advantageously have one or more of the following properties: (1) emitting in one or more parts of the visible spectrum, at least in one or more of the green, yellow and the red, especially the red, (2) having a good efficiency, (3) having a narrow band width (in the red), (4) having a high color rendering Ra (assuming a red phosphor), and (5) having other advantageous (optical) properties (such as a long life time/high stability).

The term "phosphor" is herein used for any material that upon excitation emits radiation in the visible part of the spectrum. Another term for "phosphor" may be luminescent material, but this term "luminescent material" is herein reserved for a material or material mixture comprising at least the phosphor (having formula (I) as defined herein and optionally also one or more other phosphors (see also below).

The term phosphor may in an embodiment relate to a particulate phosphor and in another embodiment relate to a (mono crystalline) phosphor layer. In a specific embodiment, the term phosphor may include a self-supporting layer, such as a ceramic polycrystalline material. Likewise, the term "luminescent material" may in an embodiment relate to a particulate "luminescent material" and in another embodiment relate to a (mono crystalline) "luminescent material" layer. In a specific embodiment, the term "luminescent material" may include a self-supporting layer, such as a ceramic material.

The term "ceramic" especially relates to a inorganic material that is obtainable by heating, like at least 500° C., especially at least 800° C., such as at least 1000° C., under high pressure, such as at least 0.5 MPa, like especially at least 1 Mpa, like 1 to about 500 MPa, such as at least 5 MPa, or at least 10 MPa, especially under uniaxial or isostatic pressure, especially under isostatic pressure, a (poly crystalline) powder. A specific method to obtain a ceramic is hot isostatic pressing (HIP), like under the temperature and pressure conditions as indicate above. The ceramic obtainable by such method may be used as such, or may be further processed (like polishing, or even processing into particles again). A ceramic especially has density that is at least 90%, such as at least 95%, like in the range of 97-100%, of the theoretical density (i.e. the density of a single crystal). A ceramic may still be polycrystalline, but with a reduced, or strongly reduce volume between grains (pressed particles or pressed agglomerate particles).

However, also in general, uniaxial or isostatic pressure may be applied to obtain the phosphor. Hence, in an embodiment, the invention also provides a method for producing the herein described phosphor by selecting starting materials in ratios that can lead to at least the desired phosphor and heating under pressure, especially uniaxial or isostatic pressure, even more especially isostatic pressure, the starting materials to produce at least the desired phosphor. Temperatures of especially at least 800° C. may be applied, up to about 1500° C., and pressures from atmospheric pressure up to the above indicated pressures or even above.

As indicated above and/or as can be derived from the above, the luminescent material, and thus also the ceramic material in case a ceramic luminescent material is applied, may include one or more of the herein described phosphors and optionally one or more of (a) one or more other type of phosphors, (b) one or more other phases formed during synthesis of the one or more of the herein described phosphors (respectively), (c) one or more starting materials used during synthesis of the one or more of the herein described phosphors (respectively), (d) one or more fluxes used during synthesis of the one or more of the herein described phosphors (respectively), (e) one or more scattering materials, and (f) one or more other materials (such as a halide salt).

In an embodiment, the term "phosphor" may relate to a combination of different phosphors all complying with formula (I). The term "formula (I)" may also be indicated as "chemical formula (I)". Hence, the luminescent material at least comprises one or more phosphors having the chemical formula (I) and optionally one or more other phosphors not having this chemical formula (I) (such as e.g. $Y_3Al_5O_{12}$:$Ce^{3+}$ and/or $Sr_2Si_5N_8$:$Eu^{2+}$).

The novel phosphors can be made with solid state synthesis methods. Synthesis of the claimed materials can e.g. be carried out by a variety of processing methods. It has been found that keeping firing temperatures low (below ~1500° C., such as below 1400° C.) may improve phase purity and luminescence properties of the claimed phases. Hence, the invention also relates to a solid state nitride synthesis method performed at a temperature below 1400° C., and the phosphors of formula (I) obtainable by such synthesis method. It turned out that reactive precursors like intermetallic phases obtained by melting of the constituent M, Z, A, B, C, D and E metals, alkaline earth amides, or silicon diimide are especially suitable. The addition of flux materials like fluorides or chlorides, especially at least fluorides, may also improve phase formation. Although not explicitly accounted for in the given formulas part of the added halide flux may remain within the phosphor after firing without deteriorating its luminescence properties. The same holds for other impurities like carbon that may to some extend be incorporated into the lattice on nitrogen lattice sites during reactions in e.g. a graphite furnace or by application of a carbon reduction and nitridation (CRN) reaction method. Suitable synthesis methods comprise (a) high pressure nitridation, (b) processing in alkaline metal melts, (c) ammonothermal synthesis and (d) standard mix and fire approaches. In a specific embodiment, one or more of the starting materials comprise hydrides (such as $SrH_2$), and optionally as synthesis method hot isostatic pressing (HIP) is applied. In yet a specific embodiment, one or more of the starting materials comprise hydrides (such as $SrH_2$), and a surplus of earth alkali metal is applied in the form of alkali metal fluoride (such as $SrF_2$), and optionally as synthesis method hot isostatic pressing (HIP) is applied.

Such synthesis methods are known in the art, and are for instance described in Watanabe, et al, Synthesis of $Sr_{0.99}Eu_{0.01}AlSiN_3$ from intermetallic precursor, Journal of the Ceramic Society of Japan 117 (2009) 115-119; Zeuner et al, $Li_2CaSi_2N_4$ and $Li_2SrSi_2N_4$— a Synthetic Approach to Three-Dimensional Lithium Nitridosilicates European Journal of Inorganic Chemistry (2010) 4945-495; and Li et al, Low-Temperature Crystallization of Eu-Doped Red-Emitting $CaAlSiN_3$ from Alloy-Derived Ammonometallates, Chemistry of Materials 19 (2007) 3592-3594.

It appeared that the phosphors of formula (I) which have been made by the inventors have a $UCr_4C_4$ host lattice structure or a $NaLi_3SiO_4$ host lattice structure or a $KLi_3GeO_4$ host lattice structure. A plurality of phosphors were made, and all had one of those host lattice structures. The Rötgen data of the systems made comply with the information published by D. G. Park et al., Solid State Sci., 10 (2008), pp. 1846-1852, which describes two isostructural Mg-containing quaternary nitrides, $Sr(Mg_3Ge)N_4$ and $Sr(Mg_2Ga_2)N_4$, that were obtained as single crystals from their constituent elements in molten Na. $Sr(Mg_3Ge)N_4$ and $Sr(Mg_2Ga_2)N_4$ both crystallize in space group I4/m (No. 87) with a=8.316(1), c=3.398(1) Å, Z=2, and a=8.2925(7), c=3.3585(5) Å, Z=2, respectively. The two compounds are isoelectronic, with two $Ga^{3+}$ in $Sr(Mg_2Ga_2)N_4$ replaced by one $Mg^{2+}$ and one $Ge^{4+}$ in $Sr(Mg_3Ge)N_4$. Condensed nitridometallate anions, $_\infty^3[(Mg_3Ge)N_4]^{2-}$ and $_\infty^3[(Mg_2Ga_2)N_4]^{2-}$, form a 3D-network structure with basket-shaped cavities, which are occupied by the $Sr^{2+}$ counter-cations. Each $Sr^{2+}$ coordinates to eight N in a symmetric, near cubic conformation, with all Sr—N bond lengths of 2.86 Å.

It is believed that $Eu^{2+}$ or other rare earth cations, like $Ce^{3+}$, is incorporated onto M lattice sites that are coordinated by six to eight N atoms depending on the size of the alkaline earth cation.

While compositions that crystallize in the $UCr_4C_4$ structure type (space group I4/m, see the table below for example) may show a mixed occupation of divalent A, trivalent B, tetravalent C and monovalent D of the cation site with multiplicity 8 (Wyckoff letter h), compositions that crystallize in the $NaLi_3SiO_4$ structure type (space group $I4_1/a$) or $KLi_3KSiO_4$ structure type (space group P-1) show an ordered distribution of divalent A, trivalent B tetravalent C atoms and monovalent D atoms. The ordered $NaLi_3SiO_4$ structure for example seems to form preferably for C=Si and A and/or B are larger atoms. The ordered $KLi_3KSiO_4$ structure seems to form preferably for D=Li and a large M atom like Sr or Ba. XRD patterns of those systems are known in the art. The $UCr_4C_4$ structure has a powder diffraction pattern PDF-Nr. 00-040-1029, the $NaLi_3SiO_4$ structure has a powder diffraction pattern PDF-Nr. 00-039-0162 and the $KLi_3GeO_4$ structure has a powder diffraction pattern PDF-Nr. 01-077-0269. Hence, the invention especially pertains to a phosphor having chemical formula (I) and crystallizing in the space group I4/m (No. 87) or the space group $I4_1/a$ (No. 88) or the space group P-1 (No. 2), with the former being an aristotype and the latter ordered structure variants of the former. For example, the $UCr_4C_4$ and $NaLi_3SiO_4$ structures form a klassengleiche (class equivalent) group-subgroup relation with a loss of translation symmetry induced by cell expansion ($a_{NaLi3SiO4}=a_{UCr4C4}*\sqrt{2}$; $c_{NaLi3SiO4}=c_{UCr4C4}*4$). It seems that all compounds having stoichiometries $M_{1-x-y-z}Z_zA_3CN_{4-n}O_n$:$ES_x$,$RE_y$ or $M_{1-x-y-z}Z_zB_3DN_{4-n}O_n$:$ES_x$,$RE_y$ (preferably crystallize in the ordered $NaLi_3SiO_4$ or $KLi_3GeO_4$ structure types (A/C ratio or B/D ratio 3/1) while other stoichiometries such as $M_{1-x-y-z}Z_zA_2B_2N_{4-n}O_n$:$ES_x$,$RE_y$ (A/B ratio 2/2) preferably crystallize in the $UCr_4C_4$ structure type. Further ordering variants of the $UCr_4C_4$ aristotype and also phases showing a mixture of long rang and short range order may form depending on applied synthesis conditions (variation of pressure, temperature) and stoichiometry ratios. Hence, in an embodiment the phosphor is selected from the group consisting of $M_{1-x-y-z}Z_zA_3CN_{4-n}$:$ES_x$,$RE_y$, $M_{1-x-y-z}Z_zB_3DN_{4-n}O_n$:$ES_x$,$RE_y$, and $M_{1-x-y-z}Z_zA_2B_2N_{4-n}O_n$:$ES_x$,$RE_y$.

In a specific embodiment, d>0 and/or z>0, especially at least d>0. Especially, the phosphor comprises at least lithium. Compared to alkaline metal free isotypic phosphors such phosphors surprisingly show increased chemical stability and light output.

The disclosed material compositions like, for example, $Sr_{1-x}[LiAl_3]N_4$:$Eu_x$ ($KLi_3GeO_4$ structure type) or $Ca_{1-x}[Li_{0.5}MgAl_{2.5}]N_4$:$Eu_x$ ($UCr_4C_4$ structure type) show significantly increased hydrolysis stability and light output compared to alkaline metal free compositions such as e.g. $Sr_{1-x}[Mg_3Si]N_4$:$Eu_x$ ($NaLi_3SiO_4$ structure type) or $Ca_{1-x}[Mg_2Al_2]N_4$:$Eu_x$ ($UCr_4C_4$ structure type). It is thought that the incorporation of monovalent alkaline metal ions leads to increased connectivity of the remaining higher valency cations through edge and vertex sharing of $B^{III}(N,O)_4$, $C^{IV}(N,O)_4$ or $E^V(N,O)_4$ tetrahedral units. It is further thought that this leads to an overall decrease of the N and O atom charge density and thus increases the hydrolysis stability. The observed increased light output may be due to increased crystallinity (self-fluxing action of the alkaline atoms) or due to a larger energetic distance of the lowest lying $Eu^{2+}$ 5d level to the bottom of the host lattice conduction band.

Larger alkaline metal cations such as $Na^+$ can be incorporated on the 8 fold (7+1 fold) coordinated M site in the $UCr_4C_4$ ($KLi_3GeO_4$, $NaLi_3SiO_4$) structure types to allow increase of the net valency of the host lattice cations. Examples are e.g. $Na_{1-x}[Mg_{1+x}Al_{3-x}]N_4:Eu_x$ or $Sr_{0.5-x}K_{0.5}[Li_{0.5}Mg_{1.5}AlSi]N_4:Eu_x$.

Preferred are phosphor compositions that lead to an ordered arrangement of host lattice cations in the lattice on the microscopic scale as e.g. observed for the $NaLi_3SiO_4$ structure type since these show the most narrow emission bands in the red spectral region if doped with divalent Eu. For the case of Li containing materials it has been found that this is possible e.g. for phosphors of composition $Sr_{1-x}[LiAl_3]N_4:Eu_x$ ($KLi_3GeO_4$ structure) or $Ca_{1-x}[LiAl_3]N_4:Eu_x$ ($NaLi_3SiO_4$ structure).

Table 1 shows cations that can be incorporated in the larger 8 fold coordinated lattice site and in the tetrahedrically coordinated lattice site with the respective effective ionic radii in pm.

TABLE 1 selected cations with their effective ionic radii (pm) that can be incorporated in the $UCr_4C_4$, $NaLi_3SiO_4$ or $KLi_3GeO_4$ structure types

| CN = 8 | | | | CN = 4 | | | | | | | |
|---|---|---|---|---|---|---|---|---|---|---|---|
| M (II) | | N (I) | | A (II) | | B (III) | | C (IV) | | D (I) | | E (V) | |
| Ca | 126 | Na | 132 | Mg | 71 | B  | 25 | Si | 40 | Li | 73 | P  | 31 |
| Sr | 140 | K  | 165 | Zn | 74 | Al | 53 | Ge | 53 | Cu | 74 | V  | 49.5 |
| Ba | 156 | Rb | 175 | Mn | 80 | Ga | 61 | Ti | 56 |    |    | Nb | 62 |
|    |     |    |     |    |    |    |    | Zr | 72 |    |    | Ta | 88 |
|    |     |    |     |    |    |    |    | Hf | 72 |    |    |    |    |

As stated above ordered variants all have a ANX type formula $ABC_3X_4$ (within the ANX type notation (of Strukturbericht) elements with a positive oxidation state are generalized under the first letters of the alphabet (A-M), elements with a negative oxidation state under the last letters (e.g. X-Z)); thus the B atom sites of the $UCr_4C_4$ structure are occupied by 1 B and 3 C atoms in ordered substructures. A first variant, the $NaLi_3SiO_4$ structure, is amongst others described above. The second variant is the $KLi_3GeO_4$ structure, which is triclinic. Below, in table 2 for some $ABC_3X_4$ compounds with the found structure types (including nitrides described in the application) is presented:

| A  | B  | C  | X | Structure type |
|----|----|----|---|----------------|
| Ca | Si | Mg | N | $NaLi_3SiO_4$ |
| Ca | Li | Al | N | $NaLi_3SiO_4$ |
| Na | Si | Li | O | $NaLi_3SiO_4$ |
| Na | Ge | Li | O | $NaLi_3SiO_4$ |
| Na | Ti | Li | O | Both variants |
| Sr | Si | Mg | N | $NaLi_3SiO_4$ |
| Sr | Li | Al | N | $KLi_3GeO_4$ |
| K  | Si | Li | O | $KLi_3GeO_4$ |
| K  | Ge | Li | O | $KLi_3GeO_4$ |
| K  | Ti | Li | O | $KLi_3GeO_4$ |
| Rb | Sn | Na | O | $NaLi_3SiO_4$ |
| Cs | Pb | Na | O | $KLi_3GeO_4$ |
| Cs | Ti | Na | O | $KLi_3GeO_4$ |

A variant isotypic to $KLi_3GeO_4$ is thus e.g. $CsNa_3PbO_4$ (see also the table above; last but one row). More information about the herein described systems may also be derived from Hoppe et al, in amongst others Z. Anorg. Allg. Chem. 622 (1996) 1715-1720, Z. Anorg. Allg. Chem. 571 (1989) 101-112, Revue de Chimie Minerale, t. 24 (1987) 96-115, and Z. Anorg. Allg. Chem. 509 (1984) 7-22. While Eu(II) doped phosphors typically show emission in the red spectral range, e.g. Ce(III) doped materials such as $Ca_{1-x}Li_{1+x}Al_{3-x}N_4:Ce_x$ show efficient luminescence in the green-yellow spectral range. These relations of emission colors are known from other known phosphors like $CaS:Eu^{2+}$ showing emission at ~650 nm and $CaS:Ce^{3+}$ showing emission at 505 nm. If the emission band position of a Eu(II) phosphor is known, the band position of Ce(III) in the same host lattice can be predicted quite accurately as shown by P. Dorenbos (J. Lumin. 91 (2000) 155-176).

Codoping of alkaline metal containing phosphors as claimed in this invention with both Ce(III) and Eu(II) may lead to phosphors with efficient red emission and reduced self-absorption of the Eu(II) emission due to low Eu concentrations. An example for such a material is e.g. $(Sr_{0.9}Ba_{0.1})_{0.988}Li_{1.01}Al_{2.99}N_4:Ce_{0.01},Eu_{0.002}$.

The equations $a+b+c+d+e=4$; and $2a+3b+4c+d+5e=10-y-n+z$, respectively, especially determine the Z, A, B, C, D and E cations and O and N anions in the lattice and thereby define (also) the charge neutrality of the system. For instance, the charge compensation is covered by the formula $2a+3b+4c+d+5e=10-y-n+z$. It covers e.g. charge compensation by decreasing O content or charge compensation by substituting a C cation by a B cation or a B cation by an A cation, etc. For example: x=0.01, y=0.02, n=0, a=3; then $6+3b+4c=10-0.02$; with $a+b+c=4$: b=0.02, c=0.98.

As will be clear to a person skilled in the art, a, b, c, d, e, n, x, y, z are always equal to or larger than zero. When a is defined in combination with the equations $a+b+c+d+e=4$; and $2a+3b+4c+d+5e=10-y-n+z$, then in principle, b, c, d, and e do not need to be defined anymore. However, for the sake of completeness, herein also $0 \le b \le 4$; $0 \le c \le 4$; $0 \le d \le 4$; $0 \le e \le 4$ are defined.

Assume a system like $SrMg_2Ga_2N_4:Eu$. Here, a=2, b=2, c=d=e=y=z=n=0. In such system, $2+2+0+0+0=4$ and $2*2+3*2+0+0+0=10-0-0+0=10$. Hence, both equations are complied with. Assume that 0.5 O is introduced. A system with 0.5 O can e.g. be obtained when 0.5 Ga—N is replaced by 0.5 Mg—O (which is a charge neutral replacement). This would result in $SrMg_{2.5}Ga_{1.5}N_{3.5}O_{0.5}:Eu$. Here, in such system $2.5+1.5+0+0+0=4$ and $2*2.5+3*1.5+0+0+0=10-0-0.5+0=9.5$. Hence, also here both equations are complied with.

As indicated above, in an advantageous embodiment d>0 and/or z>0, especially at least d>0. Especially, the phosphor comprises at least lithium.

In yet another embodiment, $2 \le a \le 3$, and especially also d=0, e=0 and z=0. In such instances, the phosphor is amongst others characterized by $a+b+c=4$; and $2a+3b+4c=10-y-n$.

In a further specific embodiment, which may be combined with the former embodiments e=0. In yet a further specific embodiment, which may be combined with the former embodiments, M is Ca and/or Sr.

Systems that are of interest with Cerium are e.g. $SrLiAl_3N_4:Ce$, but also $CaMg_2Al_2N_4:Ce$, etc.

In yet a further specific embodiment, the invention provides a coated phosphor. In yet another specific embodiment, the invention provides an embedded phosphor. In the former embodiment, the coated embodiment, especially the phosphor is a particulate phosphor, with phosphor particles comprising a coating. However, the phosphor may also comprise a layer that is coated on one or both sided with a coating. In the latter embodiment, the phosphor may be embedded in an organic or inorganic host material. For instance, the phosphor may comprise a particulate phosphor, wherein the particles of the particulate phosphor are embedded in an organic or inorganic host, like e.g. PMMA, PET, PC, silsesquioxane, glass, etc.

In a specific embodiment, the phosphor comprises an $AlPO_4$ coating. Such coating may e.g. be provided by a method described by Cho et al. (2005) in "Control of $AlPO_4$-nanoparticle coating on $LiCoO_2$ by using water or ethanol", Electrochimica Acta 50, 4182-4187. One or more alternative or additional coatings may include one or more of an $Al_2O_3$ coating and a $SiO_2$ coating.

An $Al_2O_3$ coating may be prepared by e.g. atomic layer deposition (such as e.g. described in Avci, N.; Musschoot, J.; Smet, P. F.; Korthout, K.; Avci, A.; Detavernier, C.; Poelman, D. Microencapsulation of Moisture-Sensitive $CaS:Eu^{2+}$ Particles with Aluminum Oxide. *J. Electrochem. Soc.* 2009, 156, J333-J337).

A silica coatings may for e.g. be prepared via sol-gel. Such method may include stirring phosphor powder in ethanol with some tetramethoxysilane. Then, concentrated $NH_3$ solution is added. After ammonia addition, tetraethoxysilane in ethanol can be added in a closed system while stirring; optionally sonication may be applied. The suspension thus obtained can be filtered, washed and dried.

The term "comprising" may in an embodiment refer to "consisting of" but may in another embodiment also refer to "containing at least the defined species and optionally one or more other species". The phrase "selected from the group consisting of trivalent" may refer in an embodiment to a single species selected from the group, but may in another embodiment also refer to one or more species selected from that group. Hence, sometimes the phrase "one or more selected from the group consisting of" is also applied. Therefore, phrases like "M selected from the group consisting of Ca, Sr, and Ba" may indicate one or more M (species) selected from the group consisting of Ca, Sr, and Ba. Therefore, such phrase also relate to combinations of two or more (where applicable).

Assuming ES to be samarium and europium (and optionally also (divalent) ytterbium), the value for x is still as herein indicated, but is the summation of the individual species. Likewise, this applies to all other elementary species indicated in the formula. Hence, an example of formula (I) may for instance be: $Ca_{0.45}Sr_{0.45}Mg_{1.5}ZnAl_{0.6}Ga_{0.4}Si_{0.25}Ge_{0.25}N_4$:Eu (10%), which can also be indicated as $Ca_{0.45}Sr_{0.45}EU_{0.1}Mg_{1.5}ZnAl_{0.6}Ga_{0.4}Si_{0.25}Ge_{0.25}N_4$.

Divalent and trivalent samarium and/or divalent and trivalent europium may be present depending upon e.g. the (reducing) conditions during synthesis. As luminescent ions preferably RE and ES consist of (a) $Eu^{2+}$ (i.e. no RE, and no Sm) or (b) $Ce^{3+}$ (i.e. no ES, and no other RE) or (c) $Eu^{2+}$ and $Ce^{3+}$ (i.e. no Sm and no other RE). Hence, in embodiment (a), the molar ratio between the sum of the other all optional ES and RE on the one hand, and Eu on the other hand ((Sm(II)+RE)/Eu)<0.1, especially <0.01, even more <0.0001; in embodiment (b), the molar ratio between the sum of the other all optional ES and RE on the one hand, and Ce on the other hand ((ES+RE)/Ce)<0.1, especially <0.01, even more <0.0001; and in embodiment (b), the molar ratio between the sum of the other all optional ES and RE on the one hand, and Eu(II) and Ce on the other hand ((ES+RE)/(Ce+Eu(II))<0.1, especially <0.01, even more <0.0001. Would also Yb(II) be available, ((Sm(II)+RE)/Eu) may be redefined as ((Sm(II)+Yb(II)+RE)/Eu), with ((Sm(II)+Yb(II)+RE)/Eu))<0.1, especially <0.01, even more <0.0001.

Especially, as divalent luminescent species only one or more of Sm and Eu are chosen, especially substantially only Eu.

In another embodiment, as RE Ce and Pr are applied (especially in the absence of Sm and Eu); Pr may provide a(n additional) red luminescence. Trivalent cerium may be used to provide a yellow and/or green emitter, and/or to sensitize divalent europium (in the case both Ce and Eu are present). The species ES and RE are herein also indicated as dopants.

When ES is available and RE is available, in an embodiment y/x is preferably <0.1, especially <0.01, in case RE≠Ce. This implies that when divalent Eu and/or Sm are applied, optional trivalent lanthanides RE are present in a molar amount that is less than 10% of the molar amount of Eu and/or Sm, respectively, in case where the optional trivalent lanthanide is not cerium. In a specific embodiment, x>0, and y=0; e.g. ES is substantially exclusively europium, like as dopant divalent europium is present, and all other potentially luminescent dopants are not available, or available in molar amounts less than 0.01% of the molar amount of divalent europium.

In a specific embodiment, the phosphor may in addition or alternative to the luminescent rare earth ions (RE) (also) include non-luminescent rare earth ions. For the sake of understanding, this is not included in the basic formula, but in an alternative embodiment, the phosphor of formula (I) could also be rewritten as a phosphor having the formula $M_{1-x-y-z-z2}Z_zA_aB_bC_cD_dE_eN_{4-n}O_n$:$ES_x$,$RE_y$,$NRE_{z2}$ (formula II), with M=selected from the group consisting of Ca, Sr, and Ba; Z=selected from the group consisting of monovalent Na, K, and Rb; A=selected from the group consisting of divalent Mg, Mn, Zn, and Cd; B=selected from the group consisting of trivalent B, Al and Ga; C=selected from the group consisting of tetravalent Si, Ge, Ti, and Hf; D=selected from the group consisting of monovalent Li, and Cu; E=selected for the group consisting of P, V, Nb, and Ta; ES=selected from the group consisting of divalent Eu, Sm and Yb, especially selected group consisting of divalent Eu and Sm; RE=selected from the group consisting of trivalent Ce, Pr, Nd, Sm, Eu, Gd, Tb, Dy, Ho, Er, and Tm; NRE is selected from the group consisting of Sc (scandium), La (lanthanum), and Lu (lutetium); 0≤x≤0.2; 0≤y≤0.2; 0≤z2≤0.2; 0≤x+y≤0.4; 0≤z<1; 0<y+z≤0.2; 0≤n≤0.5; 0≤a≤4 (such as 2≤a≤3); 0≤b≤4; 0≤c≤4; 0≤d≤4; 0≤e≤4; a+b+c+d+e=4; and 2a+3b+4c=10-y-z-n. Hence, herein all embodiments relating to the phosphor I also relates to phosphor II.

In a specific embodiment, the phosphor with formula I, for instance for application in the lighting unit, complies (further) with: M=selected from the group consisting of Ca, Sr, and Ba; Z=Na or z=0; A=Mg or a=0; B=selected from the group consisting of trivalent Al and Ga; C=selected from the group consisting of tetravalent Si and Ge; D=Li or d=0; e=0; ES=Eu; RE=Ce; wherein x/y<0.1 or wherein y/x<0.1. The other conditions as indicated above, may also apply.

The conditions wherein x/y<0.1 or wherein y/x<0.1 indicate that either RE=Ce is predominantly present as luminescent species or ES=Eu is predominantly present as luminescent species. Note that these embodiments may also include the variants wherein x=0 (only Ce) or y=0 (only Eu), respectively. Conditions like "Na or z=0" indicate that Z is either Na, or there is no Z element (Na, K, and Rb).

Likewise, the condition "e=0" indicates that no E element (P, V, Nb, and Ta) is available. Impurities, see elsewhere, may however be present.

Especially good phosphors may be obtained with A comprising Mg. Further, B may especially comprise one or more of Al and Ga. In yet a further specific embodiment, C may comprise tetravalent Si; in this way, most efficient phosphors may be obtained. Further, especially RE and/or ES comprises trivalent Ce and/or divalent Eu, especially substantially only divalent Eu (and no other ES or RE). In yet a further embodiment, RE is selected from the group consisting of trivalent Ce, Pr, Sm, Gd, Tb, and Dy. In a preferred embodiment, 0<x≤0.2; in other words, at least divalent Sm and/or Eu are present, especially substantially only divalent Eu. In a further embodiment, y (and z) are (substantially) zero.

Hence, especially good phosphors may be obtained with A=Mg, B=selected from the group consisting of Al and Ga, C=tetravalent Si, ES=divalent Eu, RE=selected from the group consisting of trivalent Ce, Pr, Sm, Gd, Tb, and Dy, and 0<x≤0.2. Even more especially, M is selected from the group consisting of Ca and Sr, A comprises (especially consists of) Mg, B comprises (especially consists of) Al, C comprises (especially consists of) Si, ES comprises (especially consists of) Eu, and wherein y/x<0.1, especially <0.01, and with preferably n≤0.1, especially <0.01. Even more especially, y=0.

Hence, in a specific embodiment, the phosphor has the formula $M(Ca$ and/or $Sr)_{1-x-y}Mg_aAl_bSi_cN_{4-n}O_n:ES_x,RE_y$ (I), with ES=selected from the group consisting of divalent Eu (europium) or Sm (samarium) or Yb (ytterbium); RE=selected from the group consisting of trivalent Ce (cerium), Pr (praseodymium), Nd (neodymium), Sm (samarium), Eu (europium), Gd (gadolinium), Tb (terbium), Dy (dysprosium), Ho (holmium), Er (erbium), and Tm (thulium), wherein y/x<0.1, especially <0.01, and n≤0.1, especially <0.01, even more especially <0.001, yet even more especially <0.0001. Hence, in this embodiment, substantially samarium and or europium containing phosphors are described. For instance, when divalent Eu is present, with x=0.05, and for instance y1 for Pr may be 0.001, and y2 for Tb may be 0.001, leading to an y=y1+y2=0.002. In such instance, y/x=0.04. Even more especially, y=0. However, as indicated elsewhere when Eu and Ce are applied, the ratio y/x may be larger than 0.1.

The condition 0<x+y≤0.4 indicates that M may be substituted with in total up to 40% of ES and/or RE. The condition "0<x+y≤0.4" in combination with x and y being between 0 and 0.2 indicates that at least one of ES and RE are present. Not necessarily both types are present. As indicated above, both ES and RE may each individually refer to one or more subspecies, such as ES referring to one or more of Sm and Eu, and RE referring to one or more of Ce, Pr, Nd, Sm, Eu, Gd, Tb, Dy, Ho, Er, and Tm.

Especially, when europium is applied as divalent luminescent species or dopant, the molar ratio between samarium and europium (Sm/Eu) is <0.1, especially <0.01, especially <0.001.

The same applies when europium in combination with ytterbium would be applied. When europium is applied as divalent luminescent species or dopant, the molar ratio between ytterbium and europium (Yb/Eu) is <0.1, especially <0.01, especially <0.001. would all three together be applied, then the same molar ratios might apply, i.e. ((Sm+Yb)/Eu) is <0.1, especially <0.01, especially <0.001.

Especially, x is in the range of 0.001-0.2 (i.e. 0.001≤x≤0.2), like 0.002-0.2, such as 0.005-0.1, especially 0.005-0.08. Especially in the case of divalent Europium in the herein described systems, the molar percentage may be in the range of 0.1-5% (0.001≤x≤0.05), such as 0.2-5%, like 0.5-2%. For other luminescent ions, x may (but is not necessarily) in embodiments be equal to or larger than 1% (x equal to or larger than 0.01).

In a specific embodiment, the phosphor is selected from the group consisting of (Sr, Ca)Mg$_3$SiN$_4$:Eu, (Sr, Ca)Mg$_2$Al$_2$N$_4$:Eu, (Sr, Ca)LiAl$_3$N$_4$:Eu and (Sr, Ca)Li$_d$Mg$_a$Al$_b$N$_4$:Eu, with a, b, d as defined above.

As also indicated herein, the notation "(Sr, Ca)", and similar notations with other elements, indicates that the M-positions are occupied with Sr and/or Ca cations (or other elements, respectively).

In a further specific embodiment the phosphor is selected from the group consisting of Ba$_{0.95}$Sr$_{0.05}$Mg$_2$Ga$_2$N$_4$:Eu, BaMg$_2$Ga$_2$N$_4$:Eu, SrMg$_3$SiN$_4$:Eu, SrMg$_2$Al$_2$N$_4$:Eu, SrMg$_2$Ga$_2$N$_4$:Eu, BaMg$_3$SiN$_4$:Eu, CaLiAl$_3$N$_4$:Eu, SrLiAl$_3$N$_4$:Eu, CaLi$_{0.5}$MgAl$_{2.5}$N$_4$:Eu, and SrLi$_{0.5}$MgAl$_{2.5}$N$_4$:Eu.

Further (non-limiting) examples for such phosphors are e.g. (Sr$_{0.8}$Ca$_{0.2}$)$_{0.995}$LiAl$_{2.91}$Mg$_{0.09}$N$_{3.91}$O$_{0.09}$:EU$_{0.005}$; (Sr$_{0.9}$Ca$_{0.1}$)$_{0.905}$Na$_{0.09}$LiAl$_3$N$_{3.91}$O$_{0.09}$:EU$_{0.005}$; (Sr$_{0.08}$Ca$_{0.03}$Ba$_{0.17}$)$_{0.989}$LiAl$_{2.99}$Mg$_{0.01}$N$_4$:Ce$_{0.01}$,EU$_{0.001}$, Ca$_{0.995}$LiAl$_{2.995}$Mg$_{0.005}$N$_{3.995}$O$_{0.005}$:Yb$_{0.005}$ (YB(II)); Na$_{0.995}$MgAl$_3$N$_4$:Eu$_{0.005}$; Na$_{0.895}$Ca$_{0.1}$Mg$_{0.9}$Li$_{0.1}$Al$_3$N$_4$:Eu$_{0.005}$; Sr$_{0.99}$LiMgAlSiN$_4$:Eu$_{0.01}$; Ca$_{0.995}$LiAl$_{2.955}$Mg$_{0.045}$N$_{3.96}$O$_{0.04}$:Ce$_{0.005}$; (Sr$_{0.9}$Ca$_{0.1}$)$_{0.998}$Al$_{1.99}$Mg$_{2.01}$N$_{3.99}$O$_{0.01}$:EU$_{0.002}$; (Sr$_{0.9}$Ba$_{0.1}$)$_{0.998}$Al$_{1.99}$Mg$_{2.01}$N$_{3.99}$O$_{0.01}$:Eu$_{0.002}$.

In a further specific embodiment, the phosphor is selected from the group consisting of (Sr, Ca)Mg$_3$SiN$_4$:Eu and (Sr, Ca)Mg$_2$Al$_2$N$_4$:Eu. In yet another specific embodiment, the phosphor is selected from the group consisting of Ba$_{0.95}$Sr$_{0.05}$Mg$_2$Ga$_2$N$_4$:Eu, BaMg$_2$Ga$_2$N$_4$:Eu, SrMg$_3$SiN$_4$:Eu, SrMg$_2$Al$_2$N$_4$:Eu, SrMg$_2$Ga$_2$N$_4$:Eu, and BaMg$_3$SiN$_4$:Eu. Especially, these phosphors, and even more especially (Sr, Ca)Mg$_3$SiN$_4$:Eu and (Sr, Ca)Mg$_2$Al$_2$N$_4$:Eu may be phosphors having good luminescent properties, amongst others in terms of spectral position and distribution of the luminescence.

Of especial interest are phosphors wherein the phosphor complies with 0≤x≤0.2, y/x<0.1, M comprises at least Sr, z≤0.1, a≤0.4, 2.5≤b≤3.5, B comprises at least Al, c≤0.4, 0.5≤d≤1.5, D comprises at least Li, e≤0.4, n≤0.1, and wherein ES at least comprises Eu.

Especially, y+z≤0.1. Further, especially x+y+z≤0.2. Further, especially a is close to 0 or zero. Further, especially b is about 3. Further, especially c is close to 0 or zero. Further, especially d is about 1. Further, especially e is close to 0 or zero. Further, especially n is close to 0 or zero. Further, especially y is close to 0 or zero.

Especially good systems, in terms of quantum efficiency and hydrolysis stability are those with z+d>0, i.e. one or more of Na, K, Rb, Li and Cu(I) are available, especially at least Li, such as e.g. (Sr, Ca)LiAl$_3$N$_4$:Eu and (Sr, Ca)Li$_d$Mg$_a$Al$_b$N$_4$:Eu, with a, b, d as defined above. In a further specific embodiment the phosphor is selected from the group consisting of CaLiAl$_3$N$_4$:Eu, SrLiAl$_3$N$_4$:Eu, CaLi$_{0.5}$MgAl$_{2.5}$N$_4$:Eu, and SrLi$_{0.5}$MgAl$_{2.5}$N$_4$:Eu.

Further phosphors of special interest are (Sr, Ca,Ba)(Li, Cu)(Al,B,Ga)$_3$N$_4$:Eu, which comprises as M ion at least Sr, as B ion at least Al, and as D ion at least Li.

In yet a further embodiment, RE comprises Ce, and x/y<0.1, especially <0.01, even more especially <0.001, and n≤0.1. Hence, in this embodiment, RE comprises, or especially consists of cerium. This implies that when trivalent Ce is applied (as RE), optional divalent lanthanides SE are present in a molar amount that is less than 10% of the molar amount of Ce, respectively. For instance, when Ce is present, with y=0.05, for instance x1 for (divalent) Sm may be 0.001, and x2 for (divalent) Eu may be 0.001, leading to an x=x1+x2=0.002. In such instance, x/y=0.04. Even more especially, x=0.

Incorporation of trivalent RE, such as $Ce^{3+}$, is especially done via charge compensation in the cationic lattice (see condition 2a+3b+4c+d+5e=10−y−n+z with y being the trivalent rare earth element fraction). In practice, to produce e.g. $SrLiAl_3N_4$:Ce, and similar systems, the formula would be $(Sr_{1-x}Ce_x)Li_{1+x/2}Al_{3-x/2}N_4$. In other words, a trivalent RE cation together with a monovalent cation (of the Z and/or D type) can be introduced by replacing two divalent (of the M type) cations. Alternatively, to produce e.g. $SrMg_3SiN_4$:Ce, the formula would be $(Sr_{1-x}Ce_x)Mg_{3+x/2}Si_{1-x/2}N_4$ or to produce $CaMg_2Al_2N_4$:Ce, the formula would be $(Ca_{1-x}Ce_x)Mg_{2+x}Al_{1-x}N_4$. Due to the similarity of the $UCr_4C_4$ and $NaLi_3SiO_4$ or $KLi_3GeO_4$ structure types, accommodation of extra lower valent cations on higher valent cation sites should be possible. Most likely, incorporation of the larger and aliovalent Ce(III) ion is energetically most easy if the charge and size difference of the host lattice cations is small, as it is the case for e.g. $CaMg_2Ga_2N_4$ (see table 1).

The incorporation of oxygen via starting materials or during processing of the claimed composition can be compensated by adjustment of the host lattice cation composition as defined in above formula (s). Preferably, n is small, n<0.1, since it was found that higher O concentrations may lead to samples with reduced stability. Even more especially, n=0.

As indicated above, RE elements may be incorporated in the lattices to increase stability or to modify the emission characteristics. Incorporation of RE typically lead to a blue shift of the Eu(II) emission bands. Ce(III) incorporation may lead to emission in the green to orange spectral range. Codoping of the Eu(II) doped compounds with Ce(III) may be used to increase the absorption in the blue spectral range with Ce(III) acting as a sensitizer for the Eu(II) emission (see also above).

Referring to divalent europium: because only one lattice site may be present for $Eu^{2+}$ incorporation, the emission bands of the claimed phosphors are significantly narrower than state of the art red emitting phosphors like $M_2Si_5N_8$:Eu (M=Ba, Sr, Ca) which is advantageous in lighting applications since the amount of low energy light for which the human eye is insensitive is lowered. An advantage of the ordered structure variants that is found for some of the claimed compositions is that $Eu^{2+}$ shows narrower emission bands if incorporated in such lattices. This may be caused by less inhomogeneous broadening of the emission band. Analysis of the observed emission spectra with a simple configurational coordinate model (see Henderson, Imbusch: Optical Spectroscopy of Inorganic Solids, Clarendon Press, 1989) reveals Huang-Rhys coupling parameters S in the range 2-5 and average phonon frequencies $h\omega$ in the range 150-500 $cm^{-1}$.

In contrast to other Eu(II) doped phosphor systems, unexpectedly a number of the claimed materials show an emission blue shift if the average size of the M atoms in a mixed crystal composition is decreased. Results show that the Eu(II) emission may shift towards the blue if a smaller host lattice cation (ionic radius sequence: Ca<Sr<Ba) is incorporated while incorporation of a larger one leads to a red shift. For instance, $SrMg_3SiN_4$:Eu both doped with 20% Ca or 20% Ba, respectively, were made, with the Ca,Sr system having a blue shifted red emission compared to the $SrMg_3SiN_4$:Eu system, and with the Ba,Sr system having a red shifted red emission compared to the $SrMg_3SiN_4$:Eu system.

Hence, in an embodiment, no Ge is present, and A is only Mg.

A non-exhaustive overview of systems that were made, including some optical parameters are indicated in below table 3:

| Composition | $Ba_{0.95}Sr_{0.05}Mg_2Ga_2N_4$: Eu | $BaMg_2Ga_2N_4$: Eu | $SrMg_3SiN_4$: Eu | $SrMg_2Al_2N_4$: Eu | $BaMg_3SiN_4$: Eu |
|---|---|---|---|---|---|
| Structure type | $UCr_4C_4$ | $UCr_4C_4$ | $NaLi_3SiO_4$ | $UCr_4C_4$ | $NaLi_3SiO_4$ |
| CIE x | 0.6272 | 0.6912 | 0.7004 | 0.7062 | 0.7024 |
| CIE y | 0.3723 | 0.3086 | 0.2995 | 0.2937 | 0.2975 |
| LE (lm/W) | 240.9 | 80.5 | 72.5 | 32.1 | 35 |
| peak emission (nm) | 621 | 648 | 660 | 685 | 685 |
| FWHM (nm) | 81 | 82 | 72 | 94 | 100 |

Advantageously, the position of the emission band of $Eu^{2+}$ and/or $Ce^{3+}$ may be tuned by the concentration of $Eu^{2+}$ and $Ce^{3+}$, respectively. For instance assuming $SrMg_2Al_2N_4$: Eu, the emission maximum can be tuned between about 600 nm and about 700 nm (when varying the Eu content between about 0.1 and 5% (replacement of M by Eu)).

The term light source may in principle relate to any light source known in the art, but may especially refers to a LED-based light source, herein further indicated as LED. The description below will—for the sake of understanding—only addresses LED-based light sources. The light source is configured to provide UV and/or blue light. In a preferred embodiment, the light emitting diode is configured to generate LED light with a blue component. In other words, the light source comprises a blue LED. Hence, in an embodiment, the light source is configured to generate blue light. Especially, the LED is a solid state LED.

In yet another embodiment, the light emitting diode is configured to generate LED light with a UV component. In other words, the light source comprises a UV LED. When a UV light source is applied and blue or white light is desired, as blue component, for instance the well-known materials $BaMgAl_{10}O_{17}$:$Eu^{2+}$ or $(Sr,Ba, Ca)_5(PO_4)_3Cl$:$Eu^{2+}$ may be applied. However, also other luminescent materials that are able to convert UV light into blue light may alternatively or additionally be applied.

Preferably, the light source is a light source that during operation emits at least light at a wavelength selected from the range of 200-490 nm, especially a light source that during operation emits at least light at wavelength selected from the range of 400-490 nm, even more especially in the range of 440-490 nm. This light may partially be used by the luminescent material(s) (see below). In a specific embodiment, the light source comprises a solid state LED light source (such as a LED or laser diode).

The term "light source" may also relate to a plurality of light sources, such as 2-20 (solid state) LED light sources.

Hence, the term LED may also refer to a plurality of LEDs. Hence, in a specific embodiment, the light source is configured to generate blue light.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The luminescent material comprises one or more phosphors as described herein, and optionally one or more further phosphors selected from the group consisting of divalent europium containing nitride luminescent material or a divalent europium containing oxonitride luminescent material. The red luminescent material may in an embodiment comprise one or more materials selected from the group consisting of (Ba,Sr, Ca)S:Eu, (Mg,Sr, Ca)AlSiN$_3$:Eu and (Ba, Sr, Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":Eu$^{2+}$", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba. The material (Ba,Sr, Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu, (i.e. 75% Ba; 25% Sr). Here, Eu is introduced and replaces at least part of M i.e. one or more of Ba, Sr, and Ca). Likewise, the material (Ba,Sr, Ca)AlSiN$_3$:Eu can also be indicated as MAlSiN$_3$:Eu wherein M is one or more elements selected from the group consisting of barium (Ba)$_5$ strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the first luminescent material comprises (Ca,Sr,Mg) AlSiN$_3$:Eu, preferably CaAlSiN$_3$:Eu. Further, in another embodiment, which may be combined with the former, the first luminescent material comprises (Ca,Sr,Ba)$_2$Si$_5$N$_8$:Eu, preferably (Sr,Ba)$_2$Si$_5$N$_8$:Eu. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

Hence, in an embodiment the luminescent material may further comprises M$_2$Si$_5$N$_8$:Eu$^{2+}$, wherein M is selected from the group consisting of Ca, Sr and Ba, even more especially wherein M is selected from the group consisting of Sr and Ba. In yet another embodiment, which may be combined with the former, the luminescent material may further comprise MSiAlN$_3$:Eu$^{2+}$, wherein M is selected from the group consisting of Ca, Sr and Ba, even more especially wherein M is selected from the group consisting of Sr and Ba.

The luminescent material may also comprise one or more phosphors selected from the group consisting of a trivalent cerium containing garnet and a trivalent cerium containing oxonitride.

The oxonitride materials are in the art often also indicated as oxonitride materials.

Especially, the luminescent material may further comprise a M$_3$A$_5$O$_{12}$:Ce$^{3+}$ luminescent material, wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. In a specific embodiment, the second luminescent material comprises at least two luminescent materials of the type of M$_3$A$_5$O$_{12}$:Ce$^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as Y$_3$Al$_5$O$_{12}$:Ce$^{3+}$, and one of them may be a Y,Lu based system, such as (Y$_{0.5}$Lu$_{0.5}$)$_3$Al$_5$O$_{12}$: Ce$^{3+}$. Embodiments of garnets especially include M$_3$A$_5$O$_{12}$ garnets, wherein M comprises at least yttrium or lutetium and wherein A comprises at least aluminum. Such garnet may be doped with cerium (Ce), with praseodymium (Pr) or a combination of cerium and praseodymium; especially however with Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and 0 may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3Al_5O_{12}$:Ce, wherein x is equal to or larger than 0 and equal to or smaller than 1. The terms ":Ce" or ":Ce$^{3+}$" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}$:Ce, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

Therefore, the luminescent material may in an embodiment further comprise one or more other phosphors selected from the group consisting of a divalent europium containing nitride luminescent material, a divalent europium containing oxonitride luminescent material, a trivalent cerium containing garnet and a trivalent cerium containing oxonitride.

As will be clear to the person skilled in the art, also combinations of phosphors may be applied. Further, as will be clear to the person skilled in the art, optimization of the luminescent material(s) (or phosphors) with respect to one or more of constituting elements, activator concentration, particle size, etc. or optimization with respect to luminescent material combination(s), may be applied to optimize the illumination device.

The light source may be configured in a chamber, with reflective wall(s) (such as coated with a reflective material like $TiO_2$), and a transparent window. In an embodiment, the window is the light conversion layer. In yet a further embodiment, the window comprises the light conversion layer. This layer may be arranged upstream of the window or downstream of the window. In yet a further embodiment, light conversion layers are applied at both sides of the window.

The terms "upstream" and "downstream" relate to an arrangement of items or features relative to the propagation of the light from a light generating means (here the light source), wherein relative to a first position within a beam of light from the light generating means, a second position in the beam of light closer to the light generating means is "upstream", and a third position within the beam of light further away from the light generating means is "downstream".

The luminescent material is configured to convert at least part of the light source light. In order words, one may say that the light source is radiationally coupled to the luminescent material. When the light source comprises a substantially UV light emitting light source, the luminescent material may be configured to convert substantially all light source light that impinges on the luminescent material. In case the light source is configure to generate blue light, the luminescent material may partly convert the light source light. Dependent upon the configuration, a part of the remaining light source light may be transmitted through a layer comprising the luminescent material.

Here, a number of applications of the invention are indicated: office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, and green house lighting systems.

As indicated above, the lighting unit may be used as backlighting unit in an LCD display device. Hence, in a further aspect, the invention provides also a LCD display device comprising the lighting unit as defined herein, configured as backlighting unit.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "comprising" may in an embodiment refer to "consisting of" but may in another embodiment also refer to "containing at least the defined species and optionally one or more other species". The term "and/or" especially relates to one or more of the items mentioned before and after "and/or". For instance, a phrase "item 1 and/or item 2" and similar phrases may relate to one or more of item 1 and item 2.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The symbol "I" in graphs 2-4B, 5A-7 on the y-axis indicates the emission intensity in arbitrary units; the symbol R on the y-axis in graph 4A indicates the reflectivity with 1 being maximum reflectivity and 0 being entire absorption; SS in graph 4C indicates "Stokes shift" and FWHM indicates "full width half maximum".

DETAILED DESCRIPTION OF THE EMBODIMENTS

Figure 1A:
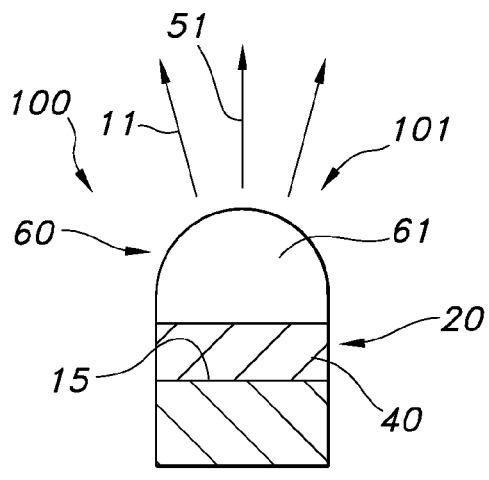
FIGS. 1a-1d schematically depict some embodiments of the lighting unit; the drawings are not necessarily on scale.

FIG. 1a schematically depicts an embodiment of the lighting unit, indicated with reference 100, of the invention. The lighting unit comprises a light source 10, which is in this schematic drawing a LED (light emitting diode). In this embodiment, on top of the light source 10, here on the (light exit) surface 15, thus downstream of the light source 10, a luminescent material 20 is provided. This luminescent material 20 comprises phosphor as described herein, indicated with reference 40. By way of example, the lighting unit 100 further comprises, for instance for light extraction properties, a (transmissive) dome 61. This is an embodiment of a transmissive optical element 60, which is in this embodiment arranged downstream of the light source 10 and also downstream of the light conversion layer 20. The light source 10 provides light source light 11, which is at least partly converted by the light conversion layer 20, at least by phosphor 40, into luminescent material light 51. The light emanating from the lighting unit is indicated with reference 101, and contains at least this luminescent material light 51, but optionally, dependent upon the absorption of luminescent material 50 also light source light 11.

Figure 1B:
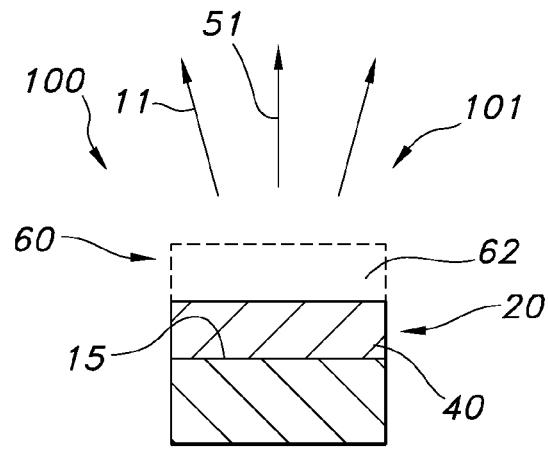

FIG. 1b schematically depicts another embodiment, without dome, but with an optional coating 62. This coating 62 is a further example of a transmissive optical element 60. Note that the coating 62 may in an embodiment be one or more of a polymeric layer, a silicone layer, or an epoxy layer. Alternatively or additionally a coating of silicon dioxide and/or silicon nitride may be applied.

Figure 1C:
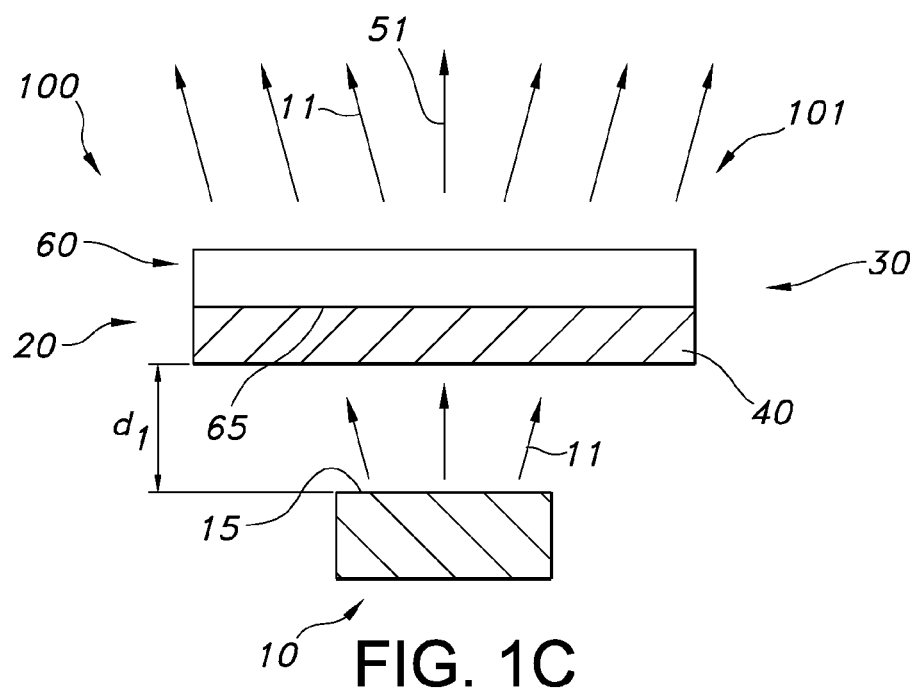

In both schematically depicted embodiment of FIGS. 1a-1b, the luminescent material 20 is in physical contact with the light source 10, or at least its light exit surface (i.e. surface 15), such as the die of a LED. In FIG. 1c, however, the luminescent material 20 is arranged remote from the light source 10. In this embodiment, the luminescent material 20 is configured upstream of a transmissive (i.e. light transmissive) support 30, such as an exit window. The surface of the support 30, to which the light conversion layer 20 is applied, is indicated with reference 65. Note that the luminescent material 20 may also be arranged downstream of the support 30, or at both sides of the support luminescent material 20 may be applied. The distance between the luminescent material 20 and the light source (especially its light exit surface 15) is indicated with reference dl, and may be in the range of 0.1 mm-10 cm. Note that in the configuration of FIG. 1c, in principle also more than one light source 10 may be applied.

Figure 1D:
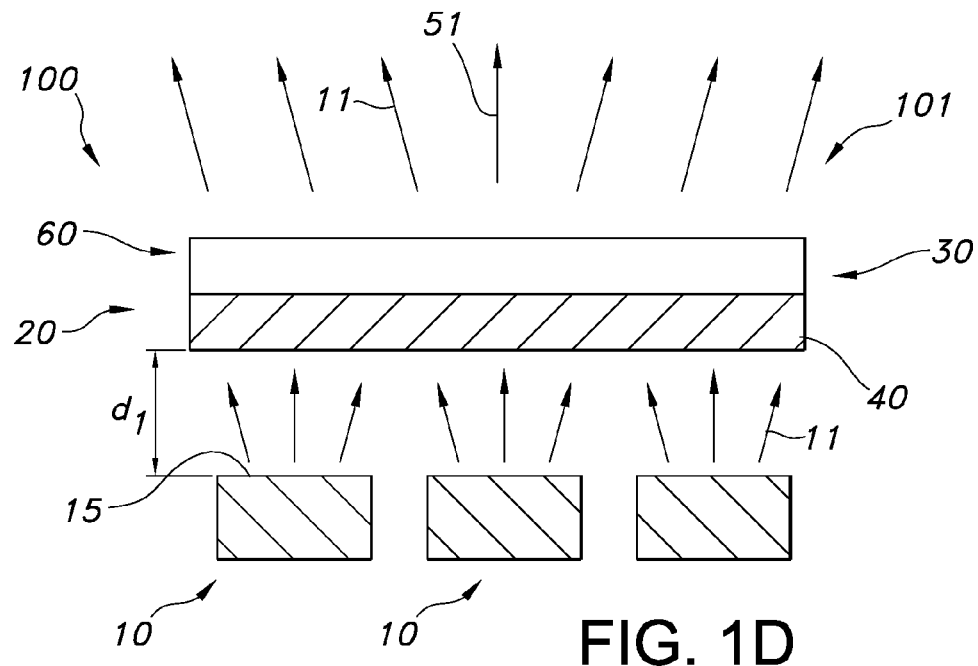

FIG. 1d is schematically the same as FIG. 1c, but now with a plurality of light sources 10.

Optionally, the luminescent material is shaped into a self-supporting layer, such as a ceramic material. In such instance, the transmissive optical element 60 may not be necessary, but may nevertheless be present.

EXPERIMENTAL

As indicated above, synthesis of the claimed materials can be carried out by a variety of processing methods. It has been found by the inventors that keeping firing temperatures low (below ~1200° C.) improves phase purity and luminescence properties of the claimed phases. It turned out that reactive precursors like intermetallic phases obtained by melting of the constituent M, Z, A, B, C, D and E metals, alkaline earth amides, or silicon diimide are especially suitable. The addition of flux materials like fluorides or chlorides is also improving phase formation. Suitable synthesis methods comprise high pressure nitridation, processing in alkaline metal melts, ammonothermal synthesis and standard mix and fire approaches.

Synthesis of $BaMg_2Ga_2N_4$:Eu 5 g $BaH_2$ powder made by hydrogenation of Ba and 1.744 g Mg powder are mixed and fired for 4 h under $N_2/H_2$ (95/5) at 800° C. 4 g of the obtained $BaMg_2N_2$ is mixed with 3.131 g GaN powder and 0.039 g $EuF_3$ and fired at 850° C. for 4 hrs. under flowing $N_2$ atmosphere followed by pressure sintering at 1000° C., 500 bar $N_2$ pressure for 4 hrs. To remove remaining $BaGa_4$ impurity phase, the pressure treatment may be repeated after milling of the sample.

Alternative Synthesis of $BaMg_2Ga_2N_4$:Eu

Starting from the elements Ba, Mg, Ga in a molar ratio of 0.24:0.26:1 with $NaN_3$ (1.3 mol %) and $EuF_3$ (0.004 mol %) in a Na-flux, the mixture is fired in weld shut metal ampoules for 48 h at 760° C. and then slowly cooled down within 165 h to 200° C. The inhomogeneous product is purified by sublimation of Na after reaction.

Synthesis of SrMg$_2$Al$_2$N$_4$:Eu

A mixture of SrAl$_2$(NH$_2$)$_8$, LiAlH$_4$, Mg, and LiN$_3$ in a molar ratio 1:2:1:2.6 with Eu(NH$_2$)$_2$ (0.03 mol %) in Li flux is fired in weld shut tantalum ampoules for 24 h at 900° C. SrMg$_2$Al$_2$N$_4$:Eu is obtained.

Synthesis of MMg$_3$SiN$_4$:Eu (M=Ca,Sr,Ba)

Starting from M, Eu, silicon diimide Si(NH)$_2$ and Mg in a molar ratio of 1:1:3, the mixture is heated in an open tungsten crucible to 900° C. in 1.5 h under nitrogen atmosphere, kept for 8 h at this temperature and subsequently quenched to room temperature by switching off the furnace. A homogeneous powder containing (M,Eu)Mg$_3$SiN$_4$ is obtained.

Alternative Synthesis of MMg$_3$SiN$_4$:Eu (M=Ca, Sr, Ba)

A mixture of MF$_2$, EuF$_3$, Mg$_3$N$_2$, Si(NH)$_2$ and LiN$_3$ in a molar ratio 0.99:0.01:1:1:2 in Li flux is fired in weld shut tantalum ampoules for 24 h at 900° C. MMg$_3$SiN$_4$:Eu is obtained. Fluoride byproducts can be removed by sublimation under vacuum.

Excitation and emission were measured with a custom-made spectrofluorimeter. The herein described phosphors are well excitable in the blue spectral range which makes them especially useful for application in phosphor converted LEDs with blue pump emission. Most of the systems have surprisingly an excitation maximum at or close to 450 nm.

Figure 2:
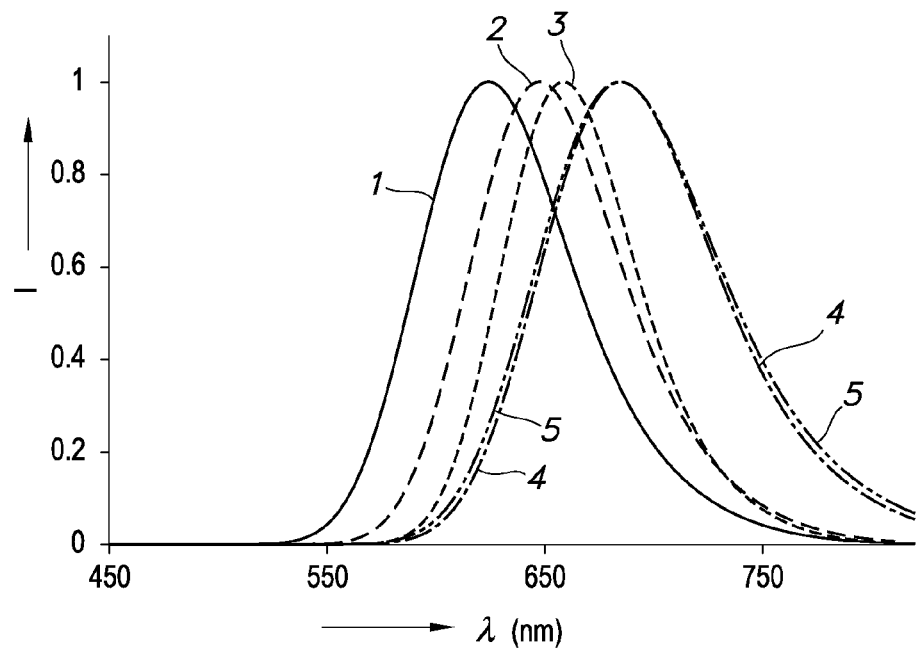
FIG. 2: Emission spectra of a plurality of different phosphors (displayed in one figure) (measured at 25°)

Emission spectra of some systems are depicted in FIG. 2. On the y-axis, the normalized intensities are displayed; on the x-axis the wavelength in nm. The emission spectra of Ba$_{0.95}$Sr$_{0.05}$Mg$_2$Ga$_2$N$_4$; Eu (1), BaMg$_2$Ga$_2$N$_4$:Eu (2), SrMg$_3$SiN$_4$:Eu (3), SrMg$_2$Al$_2$N$_4$:Eu (4), and BaMg$_3$SiN$_4$: Eu (5) are displayed; the latter two are nearly on top of each other. Further, also the luminescence of another sample that was made, Ca0.2Sr0.8Mg3SiN4:Eu (2%), was measured. The luminescence thereof is not displayed in FIG. 2, but is with respect to its spectral position comparable to the luminescence of Ba0.95Sr0.05Mg2Ga2N4:Eu(2%), but substantially narrower (FWHM), see in below table 4.

| Composition | Ba0.95Sr0.05Mg2Ga2N4: Eu(2%) | Ca0.2Sr0.8Mg3SiN4: Eu(2%) |
|---|---|---|
| Structure type | UCr4C4 | NaLi3SiO4 |
| CIE x | 0.6326 | 0.6547 |
| CIE y | 0.3669 | 0.345 |
| LE (lm/W) | 222 | 204.1 |
| peak emission (nm) | 625 | 626 |
| FWHM (nm) | 84 | 69 |

Hence, such (Ca,Sr)Mg$_3$SiN$_4$, especially with Ca/Sr in the range of 0.1-0.4, are also interesting phosphors because of the spectral position and shape of the emission (luminescence).

Further, also a Ce-doped compound, CaMg$_3$SiN$_4$:Ce (1%), crystallizing in the NaLi$_3$SiO$_4$ structure type, was measured, which has a yellow luminescence with an emission band maximum at about 585 nm and a spectral half width, FWHM, of about 90 nm.

A number of other systems were made as well, but the not all emission spectra are displayed herein.

The crystal data for Ba$_{0.95}$Sr$_{0.05}$Ga$_2$Mg$_2$N$_4$ were estimated to be:

| Space group | I4/m (No. 87) |
|---|---|
| a | 8.3883(12) Å |
| b | 8.3883(12) Å |
| c | 3.4393(7) Å |
| α | 90.00° |
| β | 90.00° |
| γ | 90.00° |
| Cell volume | 242.22(7) Å |
| Z | 2 |
| density | 2.617 g/cm$^3$ |

Also of other systems the crystal date were estimated, and appeared to be in conformance with the indicated (two) crystal structures.

Synthesis of Ca$_{1-x}$LiAl$_3$N$_4$:Eu$_x$

Figure 3:
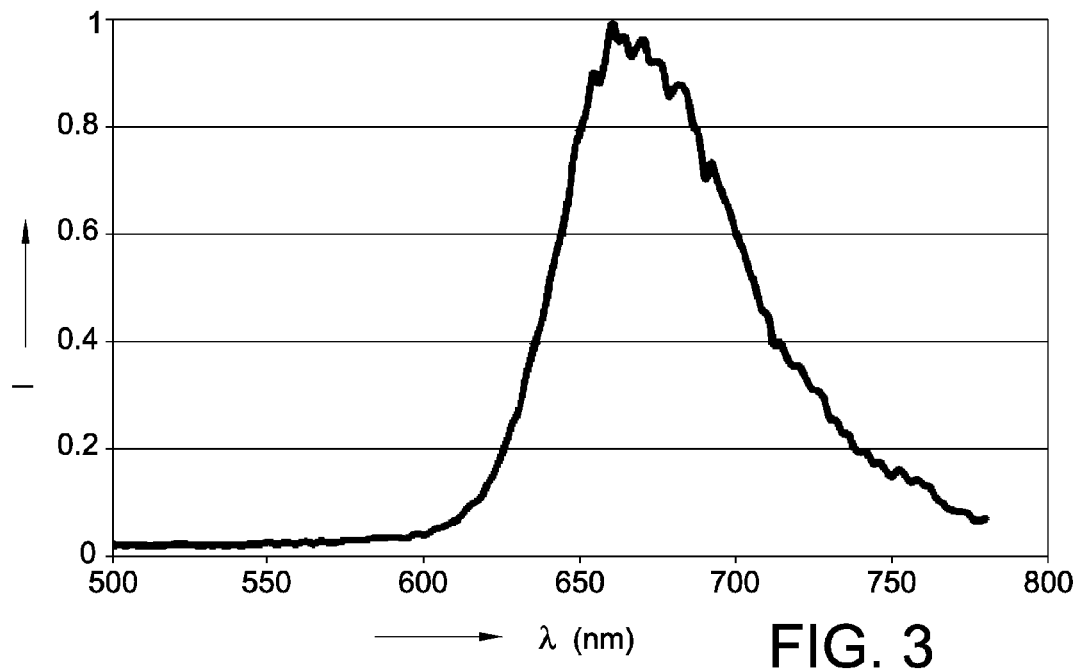
FIG. 3: Photoluminescence spectrum of $Ca[LiAl_3]N_4$ doped with 5% Europium is shown.

Stoichiometric mixtures of CaH$_2$, Li$_3$N, Al, and 1 or 5 mol % EuF$_3$ as dopant were mixed in a mortar under a protective nitrogen atmosphere. The powders were fired at 1250° C. under a nitrogen atmosphere for at least 5 hours. The photoluminescence spectrum of the phosphor excited at 444 nm reveals an emission peak at about 660 nm with a full width at half maximum (FWHM) of approximately 67 nm as visible in FIG. 3 (5% Eu sample).

The lattice constants of the phosphor Ca[LiAl$_3$]N$_4$ obtained from X-ray diffraction measurements of a single-crystal are as follows:

Crystal system: Tetragonal
Space group: I4$_1$/a
a (Å): 11.1600
c (Å): 12.8650
Volume of cell (10$^6$ pm$^3$): 1602.28
SrLiAl$_3$N$_4$:Eu(1%)

Figure 4A:
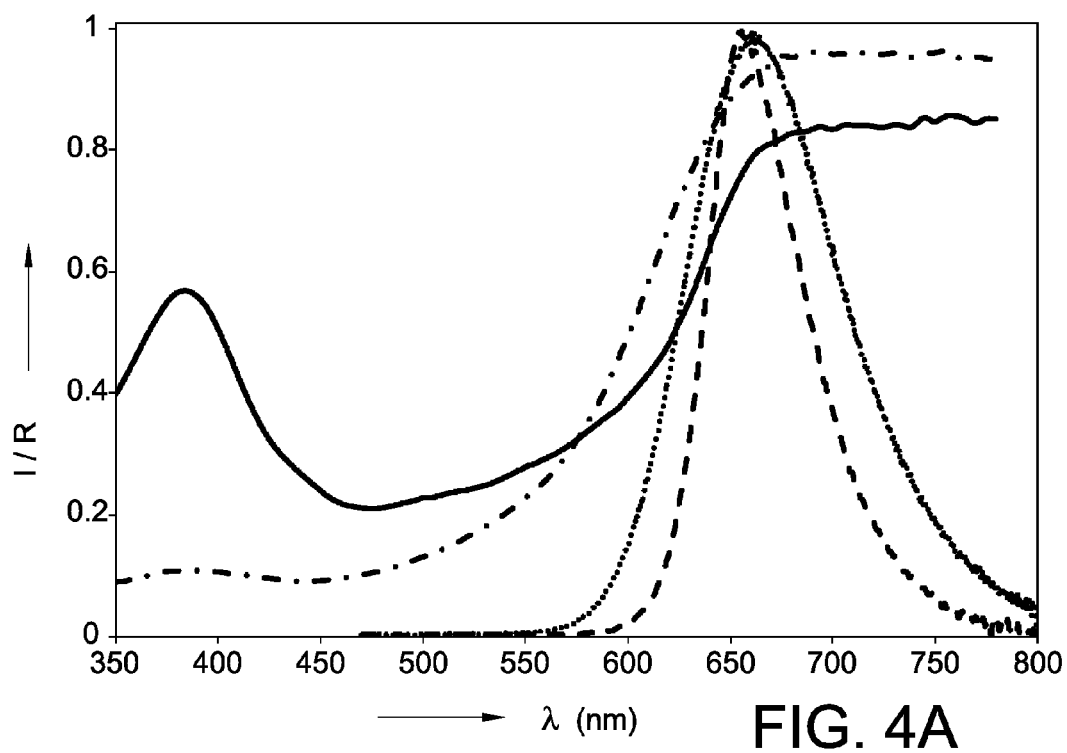
FIG. 4a: Photoluminescence spectrum of $Sr[LiAl_3]N_4$ doped with 1% Europium in comparison with $CaSiAlN_3$:Eu (dashed); also the reflectance spectra (r) are shown.
Figure 4B:
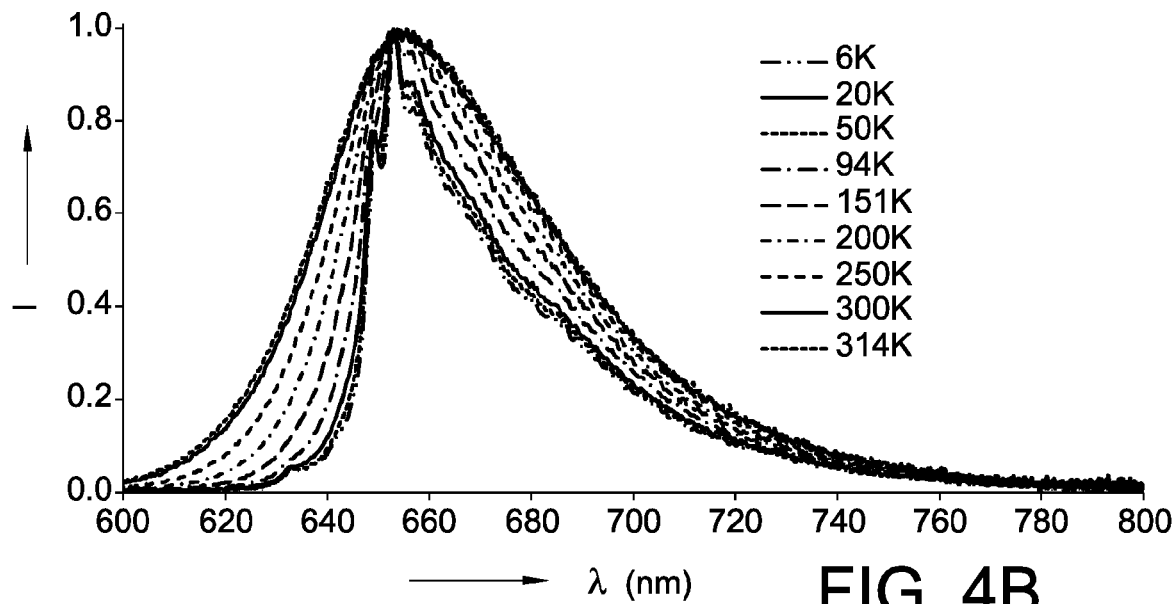
FIG. 4b.: Low T emission spectra of $SrLiAl_3N_4$:Eu(1%). Excitation wavelength: 450 nm.
Figure 4C:
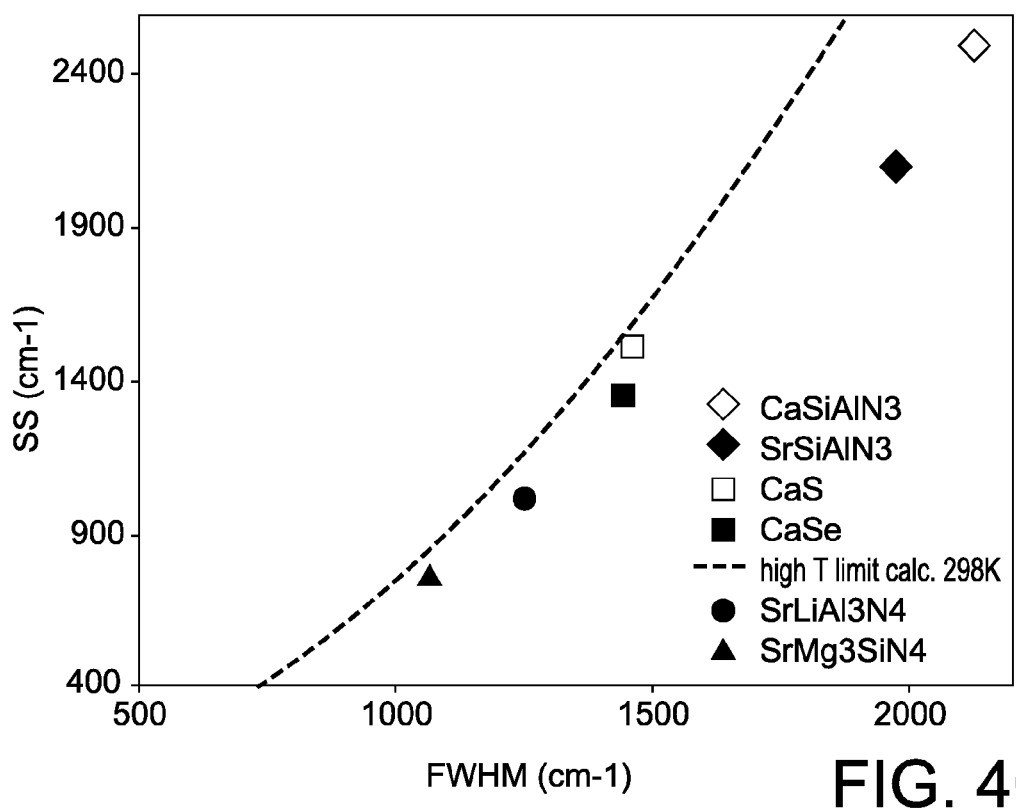
FIG. 4c: shows a comparison of emission properties of some of the claimed phosphors with state of the art red emitting phosphor materials.

The phosphor is synthesized by using a conventional solid-state reaction in nitrogen atmosphere. The mixture of the starting compounds SrH$_2$, Li$_3$N, Al, and EuF$_3$ is fired at 1250° C. for at least 5 hours. The calculated doping level of Europium is 1 mol %. The photoluminescence spectrum excited at 444 nm shows a peak emission at about 656 nm and a FWHM of approximately 49 nm, as shown in FIG. 4a. Low temperature emission measurements (FIG. 4b) show that the zero phonon line is located at 633 nm (15798 cm$^{-1}$) and the observed Stokes shift is 1014 cm$^{-1}$. FIG. 4b shows low T emission spectra of SrLiAl$_3$N$_4$:Eu(1%) at an excitation wavelength of 450 nm. FIG. 4c shows a comparison of emission properties of claimed phosphors with state of the art red emitting phosphor materials. On the x-axis, the emission band width (FWHM; full width half maximum) in cm$^{-1}$ is displayed, and on the y-axis the Stokes shift in cm$^{-1}$. Calculated values are in the high T approximation (see Henderson, Imbusch: Optical Spectroscopy of Inorganic Solids, Clarendon Press, 1989) given by FWHM=sqr(8ln2) *sqr(2kT)*sqr(SS/2), with SS~2S*h/2π*ω.

The lattice constants obtained from a Rietveld refinement are as follows:
Crystal system: Triclinic
Space group: P-1
a (Å): 10.3303
b (Å): 7.474
c (Å): 5.8713
A 100.56°
B 110.50°
Λ 90.38°
Volume of cell ($10^6$ $pm^3$): 416.2
$CaLi_{0.5}MgAl_{2.5}N_4$:Eu(5%)

Stoichiometric mixtures of Ca, $AlF_3$, $Mg_3N_2$ and 5 mol % $EuF_3$ were put in arc welded tantalum ampoules together with $LiN_3$ and a surplus of Li metal as fluxing agent. The setup is fired at 1000° C. for at least 24 hours in inert gas atmosphere. Driving force of the reaction is the formation of the very stable LiF by metathesis. The photoluminescence spectrum of the phosphor excited at 460 nm reveals an emission peak at about 706 nm with a full width at half maximum (FWHM) of approximately 72 nm.

The lattice constants of the phosphor $CaLi_{0.5}MgAl_{2.5}N_4$ obtained from X-ray diffraction measurements of a single-crystal are as follows:
Crystal system: Tetragonal
Space group: I4/m
a (Å): 7.9921
c (Å): 3.2621
Volume of cell ($10^6$ $pm^3$): 208.36
Rietveld refinement of bulk powder samples confirmed the lattice parameters as well as the composition:
Crystal system: Tetragonal
Space group: I4/m
a (Å): 8.00392
c (Å): 3.26027
Volume of cell ($10^6$ $pm^3$): 208.8618

Figure 5A:
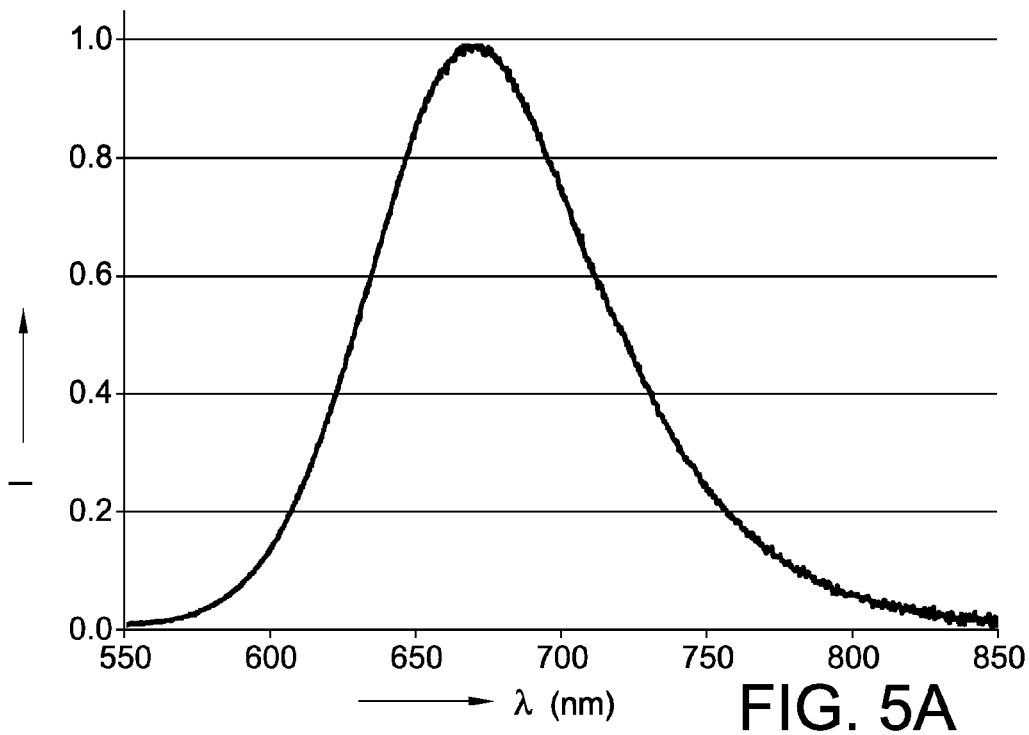
FIG. 5a: Photoluminescence spectrum of $CaLi_{0.5}MgAl_{2.5}N_4$ doped with 1% Europium.

Also a 1% Eu sample was made. The emission spectrum thereof is shown in FIG. 5a.
$SrLi_{0.5}MgAl_{2.5}N_4$:Eu(5%)

The compound is synthesized by using a solid-sate metathesis reaction in nitrogen atmosphere. Driving force of the reaction is the formation of the very stable LiF. Stoichiometric mixtures of Sr, $AlF_3$, $Mg_3N_2$ and 5 mol % $EuF_3$ were put in arc welded tantalum ampoules together with $LiN_3$ and a surplus of Li metal as fluxing agent. The setup is fired at 1000° C. for at least 24 hours in protective gas atmosphere. The photoluminescence spectrum of the phosphor excited at 450 nm reveals an emission peak at about 704 nm with a full width at half maximum (FWHM) of approximately 86 nm.

The lattice constants of the phosphor $SrLi_{0.5}MgAl_{2.5}N_4$ obtained from X-ray diffraction measurements of a single-crystal are as follows:
Crystal system: Tetragonal
Space group: I4/m
a (Å): 8.0917
c (Å): 3.3166
Volume of cell ($10^6$ $pm^3$): 217.16

Figure 5B:
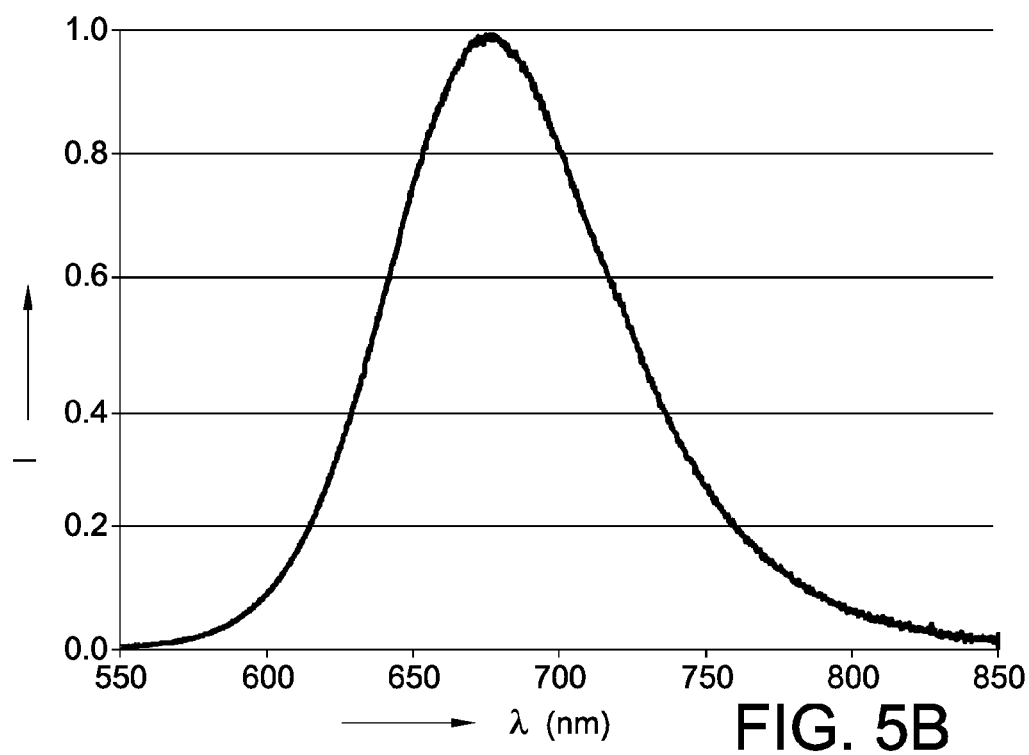
FIG. 5b: Photoluminescence spectrum of $SrLi_{0.5}MgAl_{2.5}N_4$ doped with 1% Europium.
Figure 6:
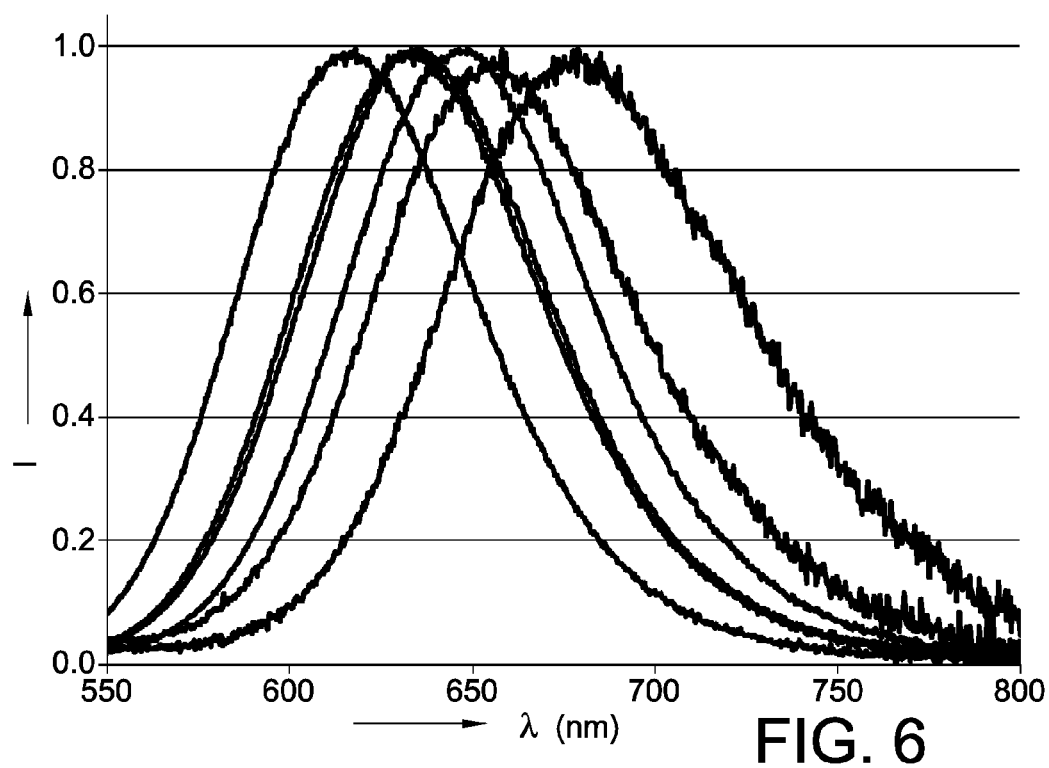
FIG. 6 displays Emission spectra of $SrMg_2Al_2N_4$:Eu with 0.1-5% (order curves from left to right: 0.1%; 0.2%; 0.5%; 1%; 2%; and 5% Eu, respectively)
Figure 7:
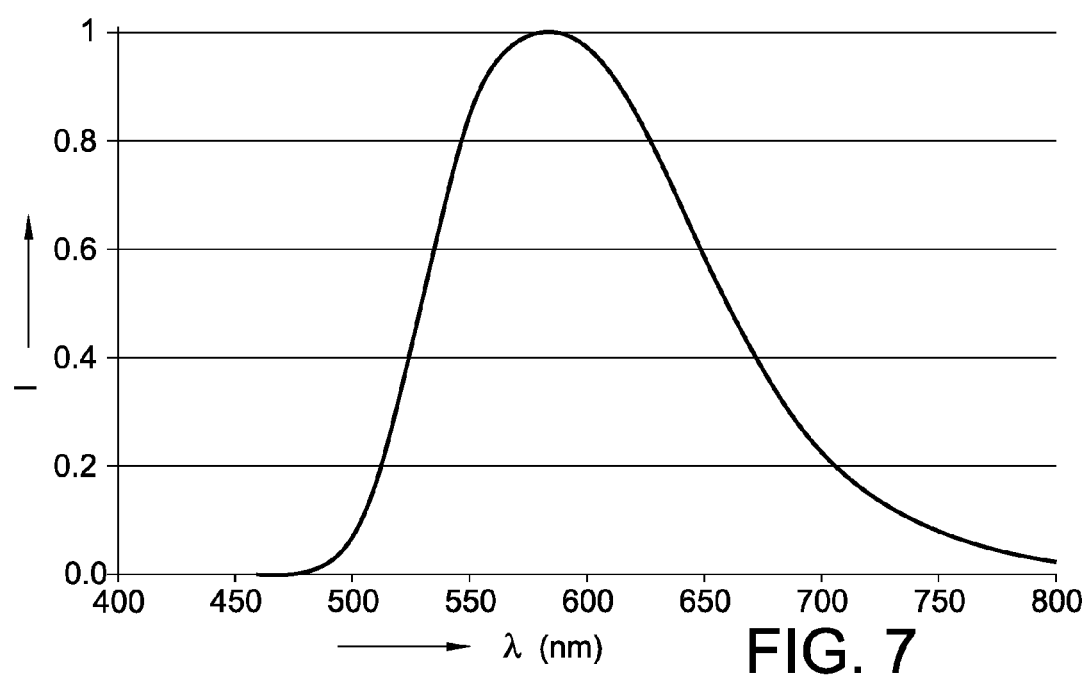
FIG. 7: Photoluminescence spectrum of $CaMg_2Al_2N_4$ doped with 1% Ce.

Also a 1% Eu sample was made. The emission spectrum thereof is shown in FIG. 5b.
Europium Concentration $SrMg_2Al_2N_4$:Eu and $BaMg_2Al_2N_4$:Eu were made as described above, with Europium concentrations varying from 0.1-5% and 0.1-1% respectively. A (red) shift of 100 nm and 50 nm, respectively, is found when increasing the concentration. Emission spectra of $SrMg_2Al_2N_4$:Eu with 0.1-5% (order curves from left to right: 0.1%; 0.2%; 0.5%; 1%; 2%; and 5% Eu, respectively) are shown in FIG. 6.
Flux Variations For several systems fluxes were varied. Here below, results for $SrMg_3SiN_4$:Eu (1%) are described.

A sample (1) was weighted in stoichiometrically and contains no $SrF_2$ (as a reference sample): 0.99 SrH2+0.01 EuF3+3 Mg+Si. A sample (2) was weighed in with 20 (mol) % of the educt SrH2 exchanged for SrF2: 0.79 SrH2+0.01 EuF3+0.2 SrF2+3 Mg+Si. A sample (3) was weighted containing 20 mol % of SrF2 in addition to the same amount of SrH2 as in sample (1): 0.99 SrH2+0.01 EuF3+0.2 SrF2+3 Mg+Si. A sample (4) was weighted containing 40% of SrF2 additionally: 0.99 SrH2+0.01 EuF3+0.4 SrF2+3 Mg+Si.

All four samples have been synthesized in a Hot Isostatic Press (HIP) in the same run, so they had the same temperature and pressure conditions and can be compared quite well. (The temperature in the HIP was raised with 150° C./h to 600° C., maintaining a N2-pressure of 3000 PSI (=207 bar). After two hours at 600° C., the temperature and pressure then have been raised with about 200° C./h to 1050° C. and 7500 PSI (=517 bar) respectively. After 5 h at 1050° C. the samples were cooled down again in 2.5 h to room temperature.)

The efficiencies of the phosphor increases from sample (1) to sample (4).
Further Data for $Sr_{1-x}LiAl_3N_4$:$Eu_x$

| Eu [mol %] | Refl at 440 nm | x | y | LE [lm/W] | FWHM [nm] | Plpeak [nm] |
| --- | --- | --- | --- | --- | --- | --- |
| 0.05 | 0.499 | 0.695 | 0.305 | 86 | 52 | 651 |
| 0.20 | 0.394 | 0.705 | 0.295 | 72 | 52 | 653 |
| 1.00 | 0.268 | 0.712 | 0.288 | 58 | 53 | 655 |

Luminescence lifetime (monoexponential fit, no afterglow observed):

| Eu [mol %] | Decay time [ns] |
| --- | --- |
| 0.2 | 789 |
| 0.2 | 794 |
| 0.2 | 780 |
| 0.6 | 798 |
| 0.4 | 793 |

Thermal quenching measurement (450 nm excitation):

| | T (° C.) | | | | |
| --- | --- | --- | --- | --- | --- |
| | 50 | 75 | 100 | 125 | 150 |
| rel. Int. | 1.00 | 1.00 | 0.99 | 0.98 | 0.97 |

| | T (° C.) | | | | | |
| --- | --- | --- | --- | --- | --- | --- |
| | 175 | 200 | 225 | 250 | 275 | 300 | 323 |
| rel. Int. | 0.95 | 0.92 | 0.89 | 0.85 | 0.81 | 0.75 | 0.69 |

$SrLiAl_3N_4$:$Eu^{2+}$ was also dispersed in a resin for a LED application with a blue emitting die (700 mA/$mm^2$, 85° C.). Good results were obtained in terms of lifetime and thermal quenching. Especially the quenching temperature is very beneficial.

The invention claimed is:

1. A lighting unit comprising a light source, configured to generate light source light and a luminescent material, configured to convert at least part of the light source light into luminescent material light, wherein the light source comprises a light emitting diode (LED), and wherein the luminescent material comprises a phosphor having a $UCr_4C_4$ structure, or an ordering variant of the $UCr_4C_4$ aristotype, or a $NaLi_3SiO_4$ structure, or a $KLi_3GeO_4$ structure, having the formula:

$$M_{1-x-y-z}Z_zA_aB_bC_cD_dE_eN_{4-n}O_n:ES_x,RE_y, \text{ wherein}$$

M is selected from the group consisting of Ca, Sr, and Ba
Z is selected from the group consisting of monovalent Na, K, and Rb
A is selected from the group consisting of divalent Mg, Mn, Zn, and Cd
B is selected from the group consisting of trivalent boron, Al and Ga
C is selected from the group consisting of tetravalent Si, Ge, Ti, and Hf
D is selected from the group consisting of monovalent Li, and Cu
E is selected from the group consisting of P, V, Nb, and Ta
ES is selected from the group consisting of divalent Eu, Sm and Yb
RE is selected from the group consisting of trivalent Ce, Pr, Nd, Sm, Eu, Gd, Tb, Dy, Ho, Er, and Tm
$0 \le x \le 0.2$; $0 \le y \le 0.2$; $0 < x+y \le 0.4$;
$0 \le z \le 1$;
$0 \le n \le 0.5$;
$0 \le a \le 4$; $0 \le b \le 4$; $0 \le c \le 4$; $0 \le d \le 4$; $0 \le e \le 4$;
$a+b+c+d+e=4$; and
$2a+3b+4c+d+5e=10-y-n+z$.

2. The lighting unit according to claim 1, wherein $z+d>0$, and $2 \le a \le 3$.

3. The lighting unit according to any one of the preceding claims, wherein
M is selected from the group consisting of Ca and Sr,
A is Mg,
B is selected from the group consisting of Al and Ga,
C is tetravalent Si,
ES is divalent Eu,
RE is selected from the group consisting of trivalent Ce, Pr, Sm, Gd, Tb, and Dy,
$0<x \le 0.2$,
$y/x<0.1$, and
$n \le 0.1$.

4. The lighting unit according to claim 1, wherein the luminescent material comprises one or more other phosphors selected from the group consisting of a divalent europium containing nitride luminescent material, a divalent europium containing oxynitride luminescent material, a trivalent cerium containing garnet and a trivalent cerium containing oxynitride, and wherein the light source is configured to generate blue light.

5. The lighting unit according to claim 1, wherein the luminescent material comprises one or more other phosphors selected from the group consisting of $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, $BaMg_3SiN_4$:Eu, $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu.

6. The lighting unit according to claim 1, wherein the phosphor complies with $0 \le x \le 0.2$, $y/x<0.1$, M comprises at least Sr, $z \le 0.1$, $a \le 0.4$, $2.5 \le b \le 3.5$, B comprises at least Al, $c \le 0.4$, $0.5 \le d \le 1.5$, D comprises at least Li, $e \le 0.4$, $n \le 0.1$, and wherein ES at least comprises Eu.

7. The lighting unit according to claim 1, wherein
M is selected from the group consisting of Ca, Sr, and Ba
Z is Na or z=0
A is Mg or a=0
B is selected from the group consisting of trivalent Al and Ga
C is selected from the group consisting of tetravalent Si and Ge
D is Li or d=0
e is 0
ES is Eu
RE is Ce wherein $x/y<0.1$ or wherein $y/x<0.1$.

8. The lighting unit according to claim 1, wherein the phosphor is selected from the group consisting of $$M_{1-x-y-z}Z_zA_3CN_{4-n}O_n:ES_x,RE_y,$$

$$M_{1-x-y-z}Z_zB_3DN_{4-n}O_n:ES_x,RE_y, \text{ and}$$

$$M_{1-x-y-z}Z_zA_2B_2N_{4-n}O_n:ES_x,RE_y.$$

9. A phosphor having a $UCr_4C_4$ structure, or an ordering variant of the $UCr_4C4$ aristotype, or a $NaLi_3SiO_4$ structure, or a $KLi_3GeO_4$ structure, having the formula:

$$M_{1-x-y-z}Z_zA_aB_bC_cD_dE_eN_{4-n}O_n:ES_x,RE_y \text{ wherein,}$$

M is selected from the group consisting of Ca, Sr, and Ba
Z is selected from the group consisting of monovalent Na, K, and Rb
A is selected from the group consisting of divalent Mg, Mn, Zn, and Cd
B is selected from the group consisting of trivalent boron, Al and Ga
C is selected from the group consisting of tetravalent Si, Ge, Ti, and Hf
D is selected from the group consisting of monovalent Li, and Cu
E is selected from the group consisting of P, V, Nb, and Ta
ES is selected from the group consisting of divalent Eu, Sm and Yb
RE is selected from the group consisting of trivalent Ce, Pr, Nd, Sm, Eu, Gd, Tb, Dy, Ho, Er, and Tm,
$0 \le x \le 0.2$; $0 \le y \le 0.2$; $0 \le x+y \le 0.4$;
$0 \le z<1$;
$0 \le n \le 0.5$;
$0 \le a \le 4$; $0 \le b \le 4$; $0 \le c \le 4$; $0 \le d \le 4$; $0 \le e \le 4$;
$a+b+c+d+e=4$; and
$2a+3b+4c+d+5e=10-y-n+z$.

10. The phosphor according to claim 9, wherein $z+d>0$.

11. The phosphor according to claim 9, wherein
A is Mg,
B is selected from the group consisting of Al and Ga,
C is tetravalent Si,
ES is divalent Eu,
RE is selected from the group consisting of trivalent Ce, Pr, Sm, Gd, Tb, and Dy,
$2 \le a \le 3$, $0 \le x \le 0.2$, $y/x<0.1$, and $n \le 0.1$.

12. The phosphor according to claim 9, wherein the phosphor is selected from the group consisting of (Sr,Ca)$Mg_3SiN_4$:Eu, (Sr,Ca)$Mg_2Al_2N_4$:Eu, (Sr,Ca)$LiAl_3N_4$:Eu, (Sr,Ca)$Li_dMg_aAl_bN_4$:Eu, $Ba_{0.95}Sr_{0.05}Mg_2Ga_2N_4$:Eu, $BaMg_2Ga_2N_4$:Eu, $SrMg_3SiN_4$:Eu, $SrMg_2Al_2N_4$:Eu, $SrMg_2Ga_2N_4$:Eu, $BaMg_3SiN_4$:Eu, $CaLiAl_3N_4$:Eu, $SrLiAl_3N_4$:Eu, $CaLi_{0.5}MgAl_{2.5}N_4$:Eu, and $SrLi_{0.5}MgAl_{2.5}N_4$:Eu.

13. The phosphor according to claim 9, wherein RE comprises Ce, and wherein x/y<0.1 and n≤0.1.

14. The phosphor according to claim 9, wherein the phosphor comprises phosphor particles having a coating, wherein the coating comprises one or more coating selected from the group consisting of an $AlPO_4$ coating, an $Al_2O_3$ coating and a $SiO_2$ coating.

15. The phosphor according to claim 9, wherein the phosphor complies with 0≤x≤0.2, y/x<0.1, M comprises at least Sr, z≤0.1, a≤0.4, 2.5≤b≤3.5, B comprises at least Al, c≤0.4, 0.5≤d≤1.5, D comprises at least Li, e≤0.4, n≤0.1, and wherein ES at least comprises Eu.

16. The phosphor according to claim 9, wherein
M is selected from the group consisting of Ca, Sr, and Ba
Z is Na or z=0
A is Mg or a=0
B is selected from the group consisting of trivalent Al and Ga
C is selected from the group consisting of tetravalent Si and Ge
D is Li or d=0
e is 0
ES is Eu
RE is Ce
wherein x/y<0.1 or wherein y/x<0.1.

17. The phosphor according to claim 9, wherein the phosphor is selected from the group consisting of $M_{1-x-y-z}Z_zA_3CN_{4-n}O_n:ES_x,RE_y$, $M_{1-x-y-z}Z_zB_3DN_{4-n}O_n:ES_x,RE_y$, and $M_{1-x-y-z}Z_zA_2B_2N_{4-n}O_n:ES_x,RE_y$.

18. An LCD display device comprising the lighting unit according to claim 1 configured as a backlighting unit.

19. The lighting unit according to claim 1, wherein:
M is selected from the group consisting of Ca and Sr;
A is Mg;
B is selected from the group consisting of Al and Ga;
C is tetravalent Si;
ES is divalent Eu;
RE comprises Ce;
x/y<0.1; and
n≤0.1.

* * * * *